(12) United States Patent
Lee et al.

(10) Patent No.: US 10,790,340 B2
(45) Date of Patent: Sep. 29, 2020

(54) DISPLAY DEVICE

(71) Applicant: Samsung Display Co., Ltd., Yongin-si (KR)

(72) Inventors: Hyeonbum Lee, Hwaseong-si (KR); Hyoeng-ki Kim, Suwon-si (KR); Kwangwoo Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/402,415

(22) Filed: May 3, 2019

(65) Prior Publication Data

US 2019/0371865 A1 Dec. 5, 2019

(30) Foreign Application Priority Data

May 31, 2018 (KR) .......................... 10-2018-006829

(51) Int. Cl.
| H01L 51/52 | (2006.01) |
| H01L 27/32 | (2006.01) |
| H01L 51/50 | (2006.01) |

(52) U.S. Cl.
CPC .......... *H01L 27/322* (2013.01); *H01L 27/323* (2013.01); *H01L 27/3246* (2013.01); *H01L 27/3272* (2013.01); *H01L 27/3276* (2013.01); *H01L 51/5012* (2013.01); *H01L 51/5284* (2013.01); *H01L 51/5281* (2013.01)

(58) Field of Classification Search
CPC . H01L 27/322; H01L 27/323; H01L 27/3246; H01L 51/5012; H01L 51/5281; H01L 51/5284

See application file for complete search history.

(56) References Cited

U.S. PATENT DOCUMENTS

| 9,304,361 | B2* | 4/2016 | Kim | .................. G02F 1/1339 |
| 9,536,930 | B2 | 1/2017 | Sasaki et al. | |
| 10,504,986 | B2* | 12/2019 | Kim | .................. H01L 27/323 |
| 2015/0015530 | A1* | 1/2015 | Kim | .................. G06F 3/044 |
| | | | | 345/174 |
| 2015/0371573 | A1 | 12/2015 | Choi et al. | |

(Continued)

FOREIGN PATENT DOCUMENTS

| JP | 6134236 | 5/2017 |
| KR | 10-2015-0069712 | 6/2015 |

(Continued)

*Primary Examiner* — Nicholas J Tobergte

(74) *Attorney, Agent, or Firm* — H.C. Park & Associates, PLC

(57) ABSTRACT

A display device includes a display panel and an anti-reflection unit directly disposed on the display panel. The display panel includes first to third light emitting elements, each of which includes first and second electrodes, and a light emitting layer, which is disposed between the first electrode and the second electrode. The pixel definition layer includes a first portion, in which a light-emitting opening exposing the first electrode is defined, and a second portion, which is disposed on and overlapped with the first portion. The anti-reflection unit includes first to third color filters overlapped with the first to third light emitting elements, respectively, and a color spacer, which is overlapped with the second portion and is thicker than each of the first to third color filters.

20 Claims, 32 Drawing Sheets

(56) References Cited

U.S. PATENT DOCUMENTS

| | | | |
|---|---|---|---|
| 2016/0306488 A1 | 10/2016 | Kim et al. | |
| 2017/0199597 A1 | 7/2017 | Son et al. | |
| 2017/0277320 A1 | 9/2017 | Choi et al. | |
| 2018/0308903 A1* | 10/2018 | Jeong | H01L 51/5281 |
| 2019/0319075 A1 | 10/2019 | Lee et al. | |
| 2020/0119113 A1* | 4/2020 | Lee | H01L 27/3276 |

FOREIGN PATENT DOCUMENTS

| | | |
|---|---|---|
| KR | 10-2016-0000096 | 1/2016 |
| KR | 10-2016-0079477 | 7/2016 |
| KR | 10-2016-0124371 | 10/2016 |
| KR | 10-2017-0014043 | 2/2017 |
| KR | 10-2017-0083670 | 7/2017 |
| KR | 10-2017-0113887 | 10/2017 |
| KR | 10-2019-0119697 | 10/2019 |

* cited by examiner

DISPLAY DEVICE

CROSS-REFERENCE TO RELATED APPLICATIONS

This application claims priority from and the benefit of Korean Patent Application No. 10-2018-0062829, filed on May 31, 2018, which is hereby incorporated by reference for all purposes as if fully set forth herein.

BACKGROUND OF THE INVENTION

Field

Exemplary embodiments of the invention relate generally to a display device, and more specifically, to a display device in which an anti-reflection unit and an input-sensing unit are integrated.

Discussion of the Background

Various display devices are being developed for use in multimedia devices, such as televisions, mobile phones, tablet computers, navigation systems, and gaming machines. A keyboard or a mouse is used as an input device of the display device. A recent display device includes a touch panel that is used as an input device.

Various signals are used to operate a display device, but such operation signals may serve as noise sources in a touch panel, thereby causing low touch sensitivity of the touch panel.

The above information disclosed in this Background section is only for understanding of the background of the inventive concepts, and, therefore, it may contain information that does not constitute prior art.

SUMMARY

An exemplary embodiment of the inventive concepts provides a display device, in which an input-sensing unit with low noise characteristics is integrated.

Additional features of the inventive concepts will be set forth in the description which follows, and in part will be apparent from the description, or may be learned by practice of the inventive concepts.

According to an exemplary embodiment, a display device may include a display panel including first to third light-emitting regions and a non-light-emitting region, which is adjacent to the first to third light-emitting regions, an anti-reflection unit directly provided on the display panel, and an input-sensing unit directly provided on the anti-reflection unit, the input-sensing unit including a sensing electrode.

In an exemplary embodiment, the display panel may include first to third light emitting elements overlapped with the first to third light-emitting regions, respectively, each of the first to third light emitting elements including a first electrode, which are in contact with a base insulating layer, and a second electrode, and a light emitting layer, which is provided between the first electrode and the second electrode, a pixel definition layer, which is in contact with the base insulating layer and is provided below the second electrode, the pixel definition layer including a first portion, in which a light-emitting opening exposing the first electrode is defined, and a second portion, which is provided on, and partially overlapped with, the first portion, and a plurality of thin films provided on the second electrode.

In an exemplary embodiment, the anti-reflection unit may include first to third color filters overlapped with the first to third light emitting elements, respectively, and a color spacer, which is overlapped with the second portion of the pixel definition layer and is thicker than each of the first to third color filters.

In an exemplary embodiment, a distance between a first portion of the sensing electrode, which is overlapped with the color spacer, and the base insulating layer may be larger than a distance between a second portion of the sensing electrode, which is not overlapped with the color spacer, and the base insulating layer.

In an exemplary embodiment, a distance between the first portion of the sensing electrode and the second electrode may be substantially equal to a distance between the second portion of the sensing electrode and the second electrode.

In an exemplary embodiment, a thickness of the color spacer may be larger than a thickness of the second portion of the pixel definition layer.

In an exemplary embodiment, the color spacer may include at least a first layer and a second layer on the first layer.

In an exemplary embodiment, the first layer may include the same material as one of the first to third color filters. The second layer may include the same material as another one of the first to third color filters.

In an exemplary embodiment, the first layer may have substantially the same thickness as the one of the first to third color filters, and the second layer may have substantially the same thickness as the another one of the first to third color filters.

In an exemplary embodiment, the first layer and the one of the first to third color filters may have a single body shape, and the second layer and the another one of the first to third color filters may have a single body shape.

In an exemplary embodiment, the color spacer may further include a third layer, which includes the same material as a remaining one of the first to third color filters. The third layer may have substantially the same thickness as the remaining one of the first to third color filters and may be provided on the first layer and the second layer.

In an exemplary embodiment, a sum of thicknesses of the second layer and the third layer may be substantially equal to a thickness of the second portion of the pixel definition layer.

In an exemplary embodiment, the anti-reflection unit further includes a light blocking layer, which is overlapped with the non-light-emitting region, and in which a light blocking opening corresponding to the light-emitting opening is defined.

In an exemplary embodiment, the light blocking layer may be provided between a topmost one of the thin films and the first layer.

In an exemplary embodiment, when viewed in a plan view, the light-emitting opening may be positioned in the light blocking opening.

In an exemplary embodiment, when viewed in a plan view, an overlapping area between the second portion of the pixel definition layer and the color spacer may be larger than or equal to 90% of an area of the color spacer.

In an exemplary embodiment, when viewed in a plan view, the second portion of the pixel definition layer may have a side length or a diameter ranging from about 10 μm to about 25 μm.

In an exemplary embodiment, the first portion and the second portion of the pixel definition layer may have a single body shape.

In an exemplary embodiment, the sensing electrode may be provided to have a mesh structure, in which an electrode opening corresponding to the light-emitting opening is defined.

According to an exemplary embodiment, a display device may include a display panel including first to third light-emitting regions and a non-light-emitting region, which is adjacent to the first to third light-emitting regions, first to third color filters directly provided on the display panel and overlapped with the first to third light-emitting regions, respectively, and an input-sensing unit directly provided on the first to third color filters. The input-sensing unit may include a sensing electrode.

In an exemplary embodiment, the display panel may include first to third light emitting elements overlapped with the first to third light-emitting regions, respectively, each of the first to third light emitting elements including a first electrode, which are in contact with a base insulating layer, and a second electrode, and a light emitting layer, which is provided between the first electrode and the second electrode, a pixel definition layer, which is in contact with the base insulating layer and is provided below the second electrode, the pixel definition layer including a first portion, in which a light-emitting opening exposing the first electrode is defined, and a second portion, which is located adjacent to the first portion and has a thickness larger than the first portion, and a plurality of thin films provided on the second electrode.

In an exemplary embodiment, a portion of the first color filter may be overlapped with the second portion, and a portion of the second color filter may be overlapped with the second portion and may be provided on the portion of the first color filter.

In an exemplary embodiment, a portion of the third color filter may be overlapped with the second portion and may be provided on the portion of the second color filter.

In an exemplary embodiment, a sum of thicknesses of the portions of the second and third color filters, which are overlapped with the second portion, may be substantially equal to the thickness of the second portion.

In an exemplary embodiment, the display device may further include a light blocking layer, which is overlapped with the non-light-emitting region, and in which a light blocking opening corresponding to the light-emitting opening is defined.

According to an exemplary embodiment, a display device may include a display panel, an input-sensing unit directly provided on the display panel, the input-sensing unit including a sensing electrode, first and second color filters provided between the display panel and the input-sensing unit, and a window unit provided on the input-sensing unit.

In an exemplary embodiment, the display panel may include first electrodes provided on a base insulating layer, a pixel definition layer provided on the base insulating layer, the pixel definition layer including a first portion, in which openings exposing the first electrodes are defined, and a second portion, which is located adjacent to the first portion and has a thickness larger than the first portion, a second electrode provided on the pixel definition layer, and light emitting layers provided between the second electrode and the first electrodes.

In an exemplary embodiment, a portion of the first color filter may be overlapped with the second portion, and a portion of the second color filter may be overlapped with the second portion and may be provided on the portion of the first color filter.

In an exemplary embodiment, a distance between a top surface of the window unit and a first portion of the sensing electrode, which is overlapped with the first portion of the pixel definition layer, may be larger than a distance between the top surface of the window unit and a second portion of the sensing electrode, which is overlapped with the second portion of the pixel definition layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
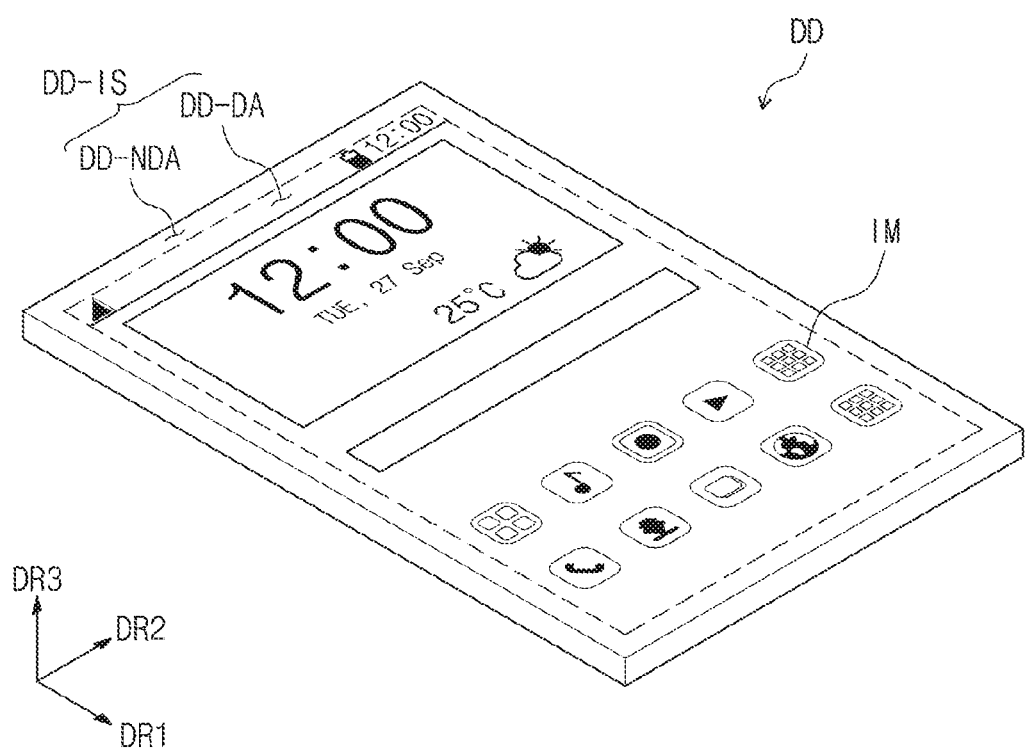
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device DD according to an exemplary embodiment. As shown in FIG. 1, the display device DD may include a display surface DD-IS, which is used to display an image IM. The display surface DD-IS may be defined to be parallel to a first direction axis DR1 and a second direction axis DR2. A normal direction of the display surface DD-IS (i.e., a thickness direction of the display device DD) will be referred to as a third direction axis DR3.

In the following description, the third direction axis DR3 may be used to differentiate a front or top surface of each element from a back or bottom surface. However, directions indicated by the first to third direction axes DR1, DR2, and DR3 may be just an example. Hereinafter, first to third directions may be directions indicated by the first to third direction axes DR1, DR2, and DR3, respectively, and will be identified with the same reference numbers.

In FIG. 1, the display device DD is illustrated to have a flat display surface, but the inventive concepts are not limited thereto. The display surface of the display device DD may have a curved or three-dimensional shape. In the case where the display device DD has the three-dimensional display surface, the display surface may include a plurality of display regions that are oriented in different directions. For example, the display device DD may have a display surface that is shaped like that of a polygonal pillar.

In the present exemplary embodiment, the display device DD may be a rigid display device. However, the inventive concepts are not limited thereto, and in an exemplary embodiment, the display device DD may be a flexible display device. In the present exemplary embodiment, the display device DD, which can be used for a cellphone terminal, is exemplarily illustrated. The cellphone terminal may further include an electronic module, a camera module, a power module, and so forth, which are mounted on a mainboard and are provided in a bracket or case, along with the display device DD. The display device DD may be used for large-sized electronic devices (e.g., television sets and monitors) or small- or medium-sized electronic devices (e.g., tablets, car navigation systems, game machines, and smart watches).

As shown in FIG. 1, the display surface DD-IS may include a display region DD-DA, which is used to display the image IM, and a non-display region DD-NDA, which is provided to be adjacent to the display region DD-DA. The non-display region DD-NDA may not be used to display an image. As an example of the image IM, icon images are shown in FIG. 1.

As shown in FIG. 1, the display region DD-DA may have a rectangular shape. The non-display region DD-NDA may be provided to surround the display region DD-DA. However, the inventive concepts are not limited to this example, and in an exemplary embodiment, shapes of the display and non-display regions DD-DA and DD-NDA may be variously changed in a complementary manner.

Figure 2A:
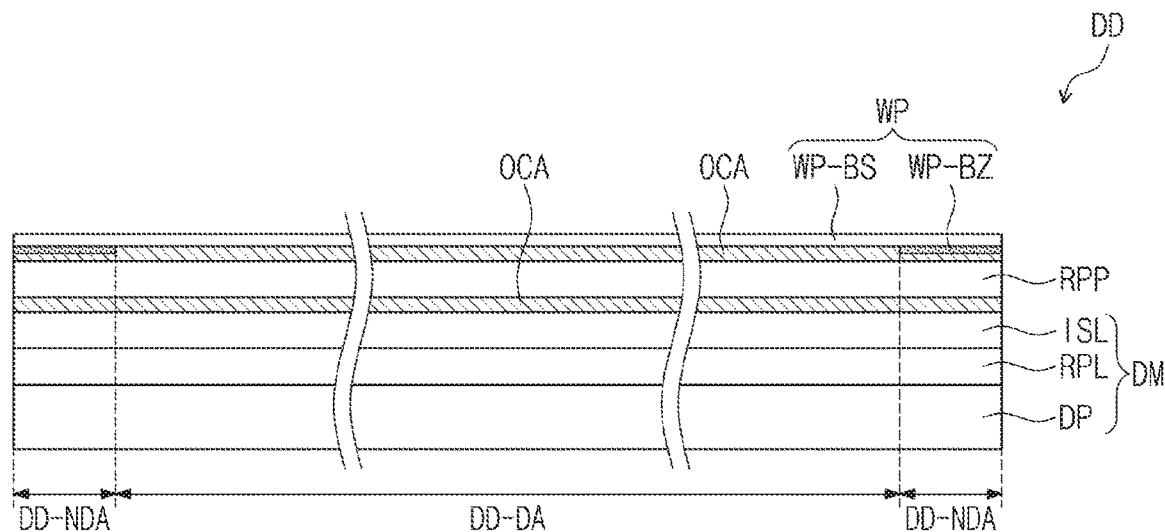
FIGS. 2A and 2B are cross-sectional views each illustrating a display device according to an exemplary embodiment.
Figure 2B:
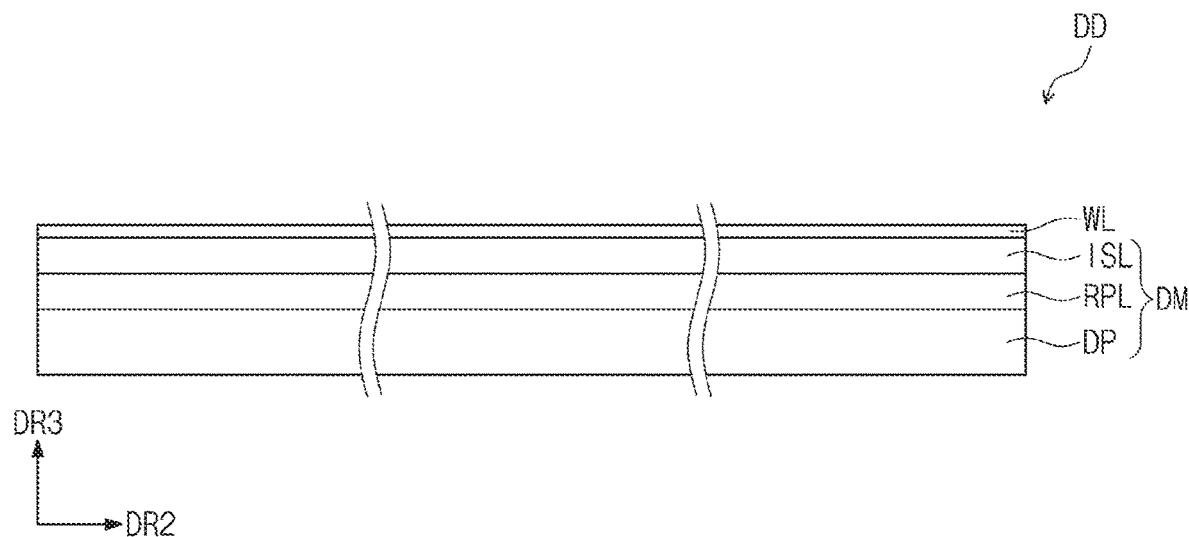

FIGS. 2A and 2B are cross-sectional views each illustrating the display device DD according to an exemplary embodiment. FIGS. 2A and 2B illustrate cross sections, each of which is taken on a plane defined by the second and third directions DR2 and DR3. In order to provide better understanding of a stacking structure of a display panel and/or functional units, the display devices DD are illustrated in a simplified manner in FIGS. 2A and 2B.

In an exemplary embodiment, the display device DD may include a display panel, an input-sensing unit, an anti-reflection unit, and a window unit. At least two of the display panel, the input-sensing unit, the anti-reflection unit, and the window unit may be formed by a successive process or may be combined with each other by an adhesive member. FIG. 2A illustrates an example in which an optically clear adhesive OCA is used as the adhesive member. In various exemplary embodiments to be described below, the adhesive member may be a typical adhesive material or a typical gluing agent. In an exemplary embodiment, the anti-reflection unit and the window unit may be replaced with other unit or may be omitted.

In FIGS. 2A and 2B, if a unit (e.g., the input-sensing unit, the anti-reflection unit, or the window unit) is formed on another element by a successive process, the unit will be expressed using a term "layer". If a unit (e.g., the input-sensing unit, the anti-reflection unit, or the window unit) is combined to another element by an adhesive member, the unit will be expressed using a term "panel". The unit expressed using the term "panel" may include a base layer (e.g., a synthetic resin film, a composite film, or a glass substrate) providing a base surface, but the unit expressed using the term "layer" may not have the base layer. In other words, the unit expressed using the term "layer" may be placed on a base surface that is provided by another element or unit.

The input-sensing unit, the anti-reflection unit, and the window unit may be referred to as an input-sensing panel, an anti-reflection panel, and a window panel or to as an input-sensing layer, an anti-reflection layer, and a window layer, according to the presence or absence of the base layer.

As shown in FIG. 2A, the display device DD may include a display panel DP, an anti-reflection layer RPL, an input-sensing layer ISL, an anti-reflection panel RPP, and a window panel WP. The anti-reflection layer RPL may be directly provided on the display panel DP, and the input-sensing layer ISL may be directly provided on the display panel DP. In the present specification, the expression "an element B may be directly provided on an element A" means that an adhesive layer/member is not provided between the elements A and B. In other words, after the formation of the element A, the element B may be formed on a base surface, which is provided by the element A, through a successive process.

Hereinafter, a structure including the display panel DP, the anti-reflection layer RPL, and the input-sensing layer ISL may be referred to as a display module DM. An optically clear adhesive OCA may be provided between the display module DM and the anti-reflection panel RPP and between the anti-reflection panel RPP and the window panel WP.

The display panel DP may be configured to generate an image, and the input-sensing layer ISL may be configured to obtain information on coordinates of an external input (e.g., a touch event). The display module DM may further include a protection member provided on a bottom surface of the display panel DP. The protection member and the display panel DP may be combined to each other by an adhesive member. The display device DD, which will be described with reference to FIG. 2B, may further include the protection member. In an exemplary embodiment, the anti-reflection panel RPP may be omitted.

According to an exemplary embodiment, the display panel DP may be a light-emitting type display panel, but the inventive concepts are not limited to a specific type of the display panel DP. For example, the display panel DP may be an organic light emitting display panel or a quantum dot light-emitting display panel. A light emitting layer of the organic light emitting display panel may be formed of or include an organic light emitting material. A light emitting layer of the quantum dot light-emitting display panel may include quantum dots and/or quantum rods. For the sake of simplicity, the description that follows will refer to an example in which the display panel DP is the organic light emitting display panel.

The anti-reflection layer RPL or the anti-reflection panel RPP may be configured to reduce reflectance of an external light that is incident from an outer space to the window panel WP. In an exemplary embodiment, the anti-reflection panel RPP may include a phase retarder and a polarizer. The phase retarder may be of a film type or a liquid crystal coating type and may include a λ/2 phase retarder and/or a λ/4 phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. The phase retarder and the polarizer may further include a protection film. At least one of the phase retarder, the polarizer, or the protection films thereof may be used as a base layer of the anti-reflection panel RPP.

In an exemplary embodiment, the anti-reflection panel RPP may include a destructive interference structure. For example, the destructive interference structure may include a first reflection layer and a second reflection layer which are provided on different layers. The first reflection layer and the second reflection layer may be configured to allow a first reflection light and a second reflection light, which are respectively reflected by them, to destructively interfere with each other, and this may make it possible to reduce reflectance of the external light.

In an exemplary embodiment, the anti-reflection layer RPL may include color filters. Each of the color filters may be configured to selectively transmit an external light of which the wavelength is within a specific wavelength range and to absorb an external light having wavelength beyond from the specific wavelength range. The anti-reflection layer RPL may further include a light blocking layer. The anti-reflection layer RPL may include an organic layer, which is provided on the color filters and/or the light blocking layer to reduce a height variation caused by the presence of the color filters and/or the light blocking layer or to have a flat top surface.

In an exemplary embodiment, the window panel WP may include a base film WP-BS and a bezel pattern WP-BZ. The base film WP-BS may include a glass substrate and/or a synthetic resin film. The base film WP-BS may not be limited to a single-layered structure. For example, in an exemplary embodiment, the base film WP-BS may include two or more films that are combined to each other by an adhesive film.

The bezel pattern WP-BZ may be partially overlapped with the base film WP-BS. The bezel pattern WP-BZ may be provided on a rear surface of the base film WP-BS to define a bezel region of the display device DD (e.g., the non-display region DD-NDA of FIG. 1).

The bezel pattern WP-BZ may be a colored organic layer and may be formed by, for example, a coating method. The bezel pattern WP-BZ may include a plurality of sequentially-stacked organic layers. A predetermined pattern may be formed in at least one of such organic layers. The window panel WP may further include at least one functional coating layer provided on the front surface of the base film WP-BS. The functional coating layer may include an anti-fingerprint layer, an anti-reflection layer, a hard coating layer, and so forth.

In FIG. 2B, the window layer WL (or the window panel WP) may be illustrated in a simplified manner (e.g., without clear distinction of the base film WP-BS and the bezel pattern WP-BZ). As shown in FIG. 2B, the display device DD may include the display panel DP, the anti-reflection layer RPL, the input-sensing layer ISL, and the window layer WL. Adhesive members may be omitted from the display device DD, and the anti-reflection layer RPL, the input-sensing layer ISL, and the window layer WL may be formed on a base surface, which is provided on the display panel DP, by a successive process.

In FIGS. 2A and 2B, the input-sensing unit ISL is illustrated to be overlapped with the entire top surface of the display panel DP, but the inventive concepts are not limited thereto. The input-sensing layer ISL may be partially or wholly overlapped with the display region DD-DA.

The input-sensing layer ISL may be a touch sensing sensor, which is configured to sense a touch event from a user, or a fingerprint sensing sensor, which is configured to read a fingerprint of a user's finger. The input-sensing layer ISL may include a plurality of sensing electrodes, and a pitch (or width) of the sensing electrodes may be changed depending on an intended use of the input-sensing layer ISL. For the touch sensing sensor, the widths of the sensing electrodes may range several millimeters to several tens of millimeters, and for the fingerprint sensing sensor, the widths of the sensing electrodes may range from several tens of micrometers to several hundreds of micrometers.

In the case of the display device DD shown in FIGS. 2A and 2B, a distance between the input-sensing layer ISL and the display panel DP may be small, compared with a panel-type input-sensing unit. This is because a thick adhesive member is not provided between the input-sensing layer ISL and the display panel DP. However, in this case, the sensing sensitivity of the input-sensing layer ISL may be greatly affected by a noise generated in the display panel DP, compared the panel-type input-sensing unit.

Figure 3A:
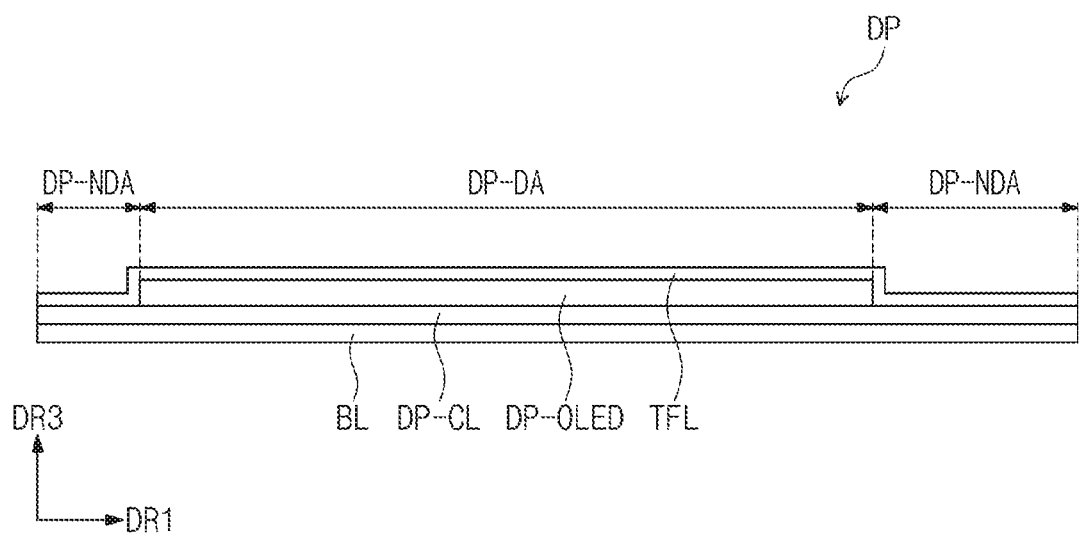
FIG. 3A is a cross-sectional view illustrating a display module according to an exemplary embodiment.
Figure 3B:
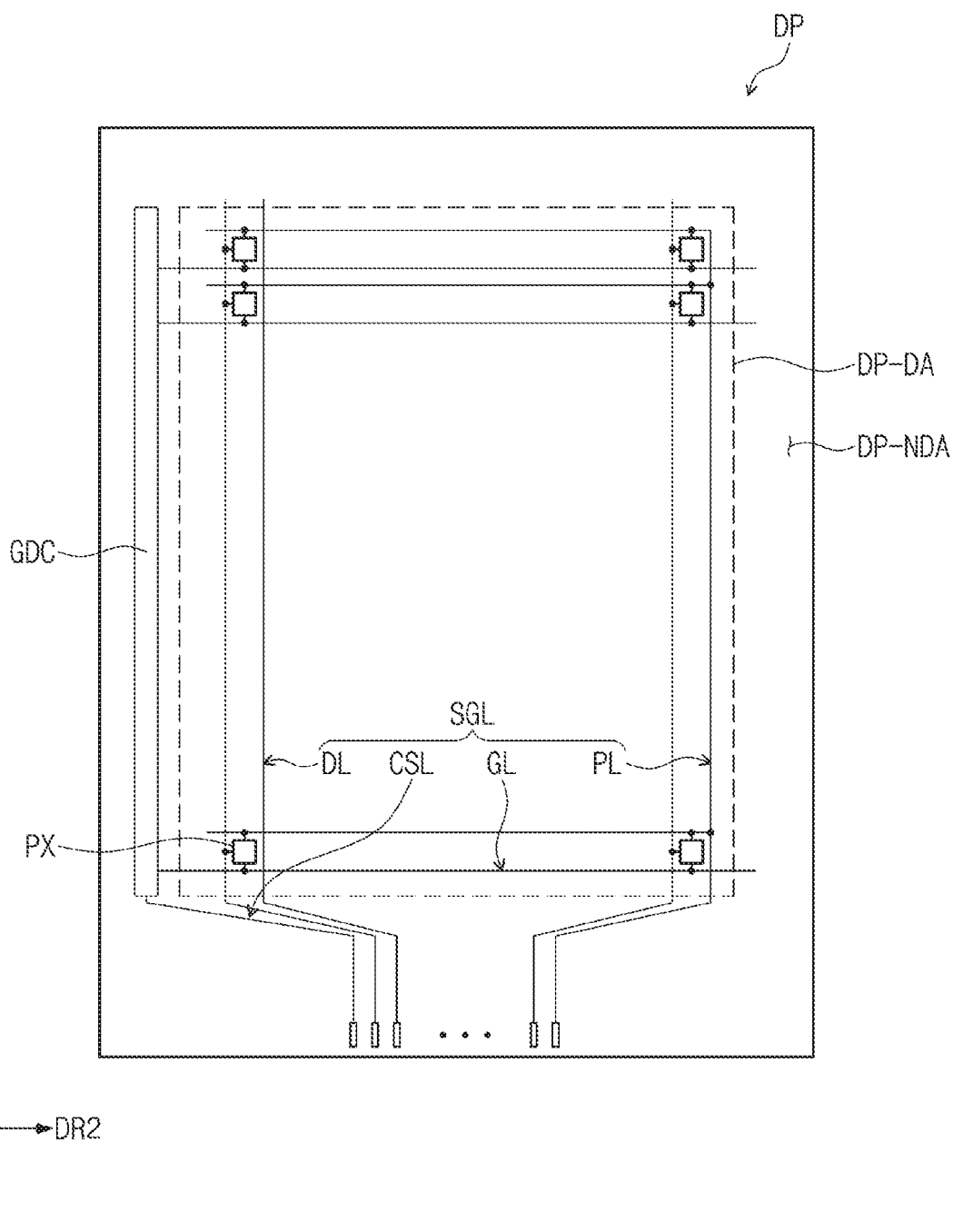
FIG. 3B is a plan view illustrating a display panel according to an exemplary embodiment.
Figure 3C:
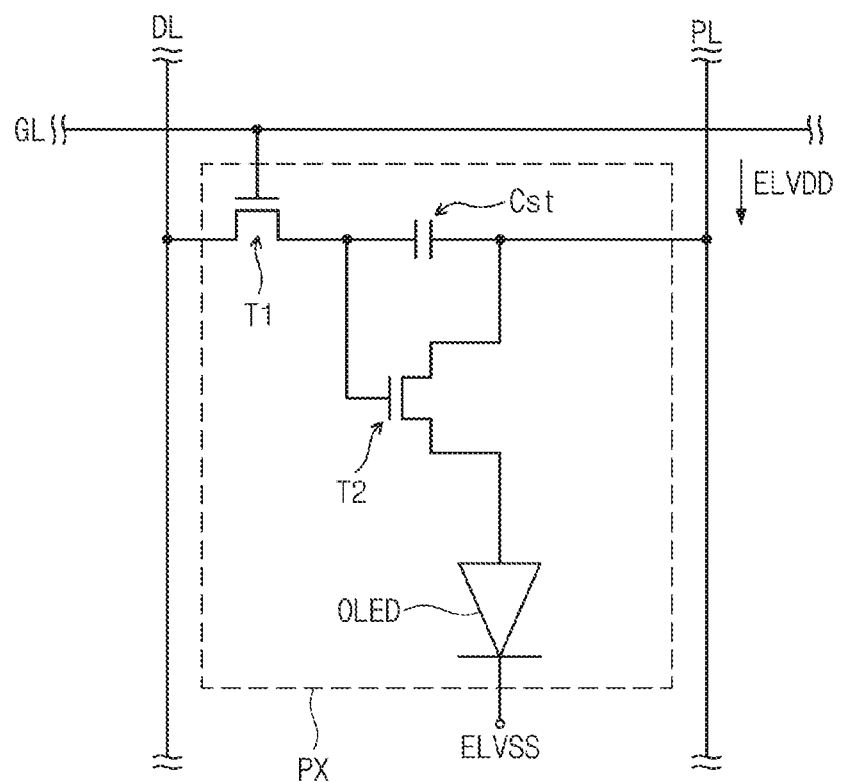
FIG. 3C is an equivalent circuit diagram illustrating the pixel according to an exemplary embodiment.
Figure 3D:
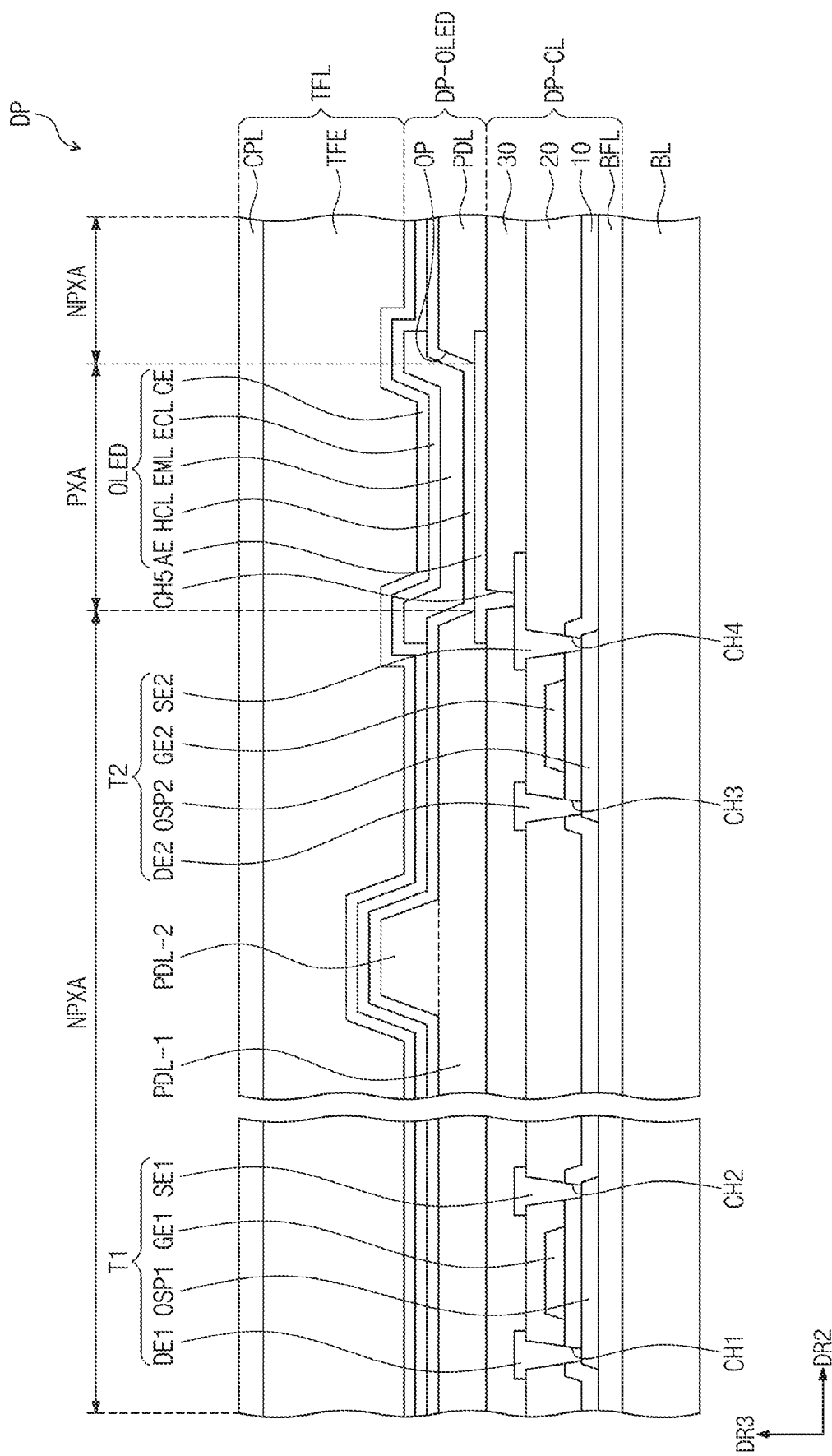
FIGS. 3D and 3E are enlarged cross-sectional views each illustrating a display panel according to an exemplary embodiment.
Figure 3E:
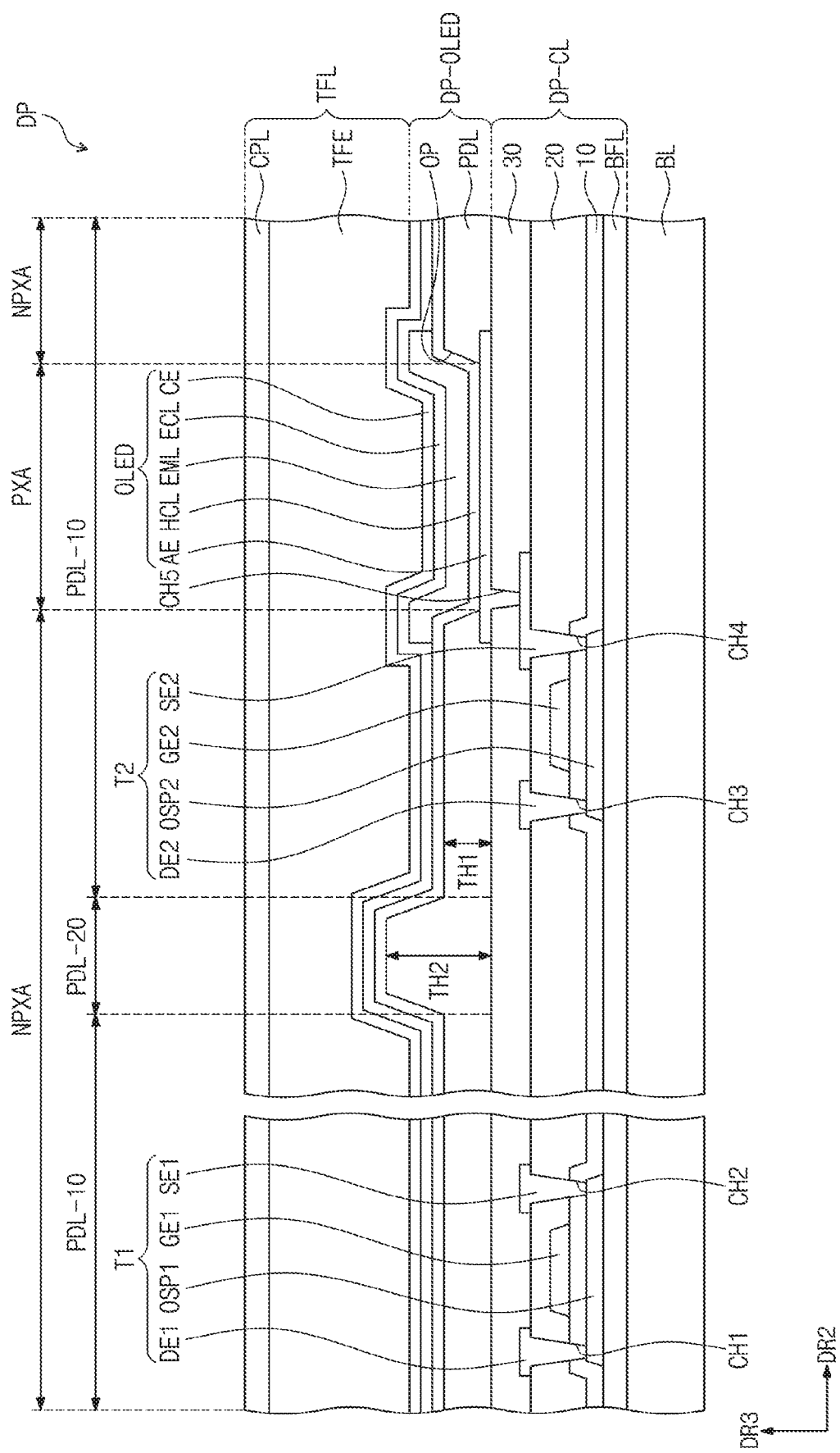

FIG. 3A is a cross-sectional view illustrating the display panel DP according to an exemplary embodiment. FIG. 3B is a plan view illustrating the display panel DP according to an exemplary embodiment. FIG. 3C is an equivalent circuit diagram illustrating a pixel PX according to an exemplary embodiment. FIGS. 3D and 3E are enlarged cross-sectional views each illustrating the display panel DP according to an exemplary embodiment. The display panel DP to be described below may be applied to all of the display devices DD described with reference to FIGS. 2A and 2B.

As shown in FIG. 3A, the display panel DP may include a base layer BL, a circuit device layer DP-CL on the base layer BL, a display device layer DP-OLED on the circuit device layer DP-CL, and an insulating layer TFL (hereinafter, an upper insulating layer) on the display device layer DP-OLED.

The base layer BL may be formed of or include a synthetic resin film. The synthetic resin layer may be formed on a working substrate, which is used to fabricate the display panel DP. Thereafter, a conductive layer, an insulating layer, and so forth may be formed on the synthetic resin layer. If the working substrate is removed, the synthetic resin layer may be used as the base layer BL. The synthetic resin layer may be a polyimide-based resin layer, and the inventive concepts are not limited to a specific material of the base layer BL. In addition, the base layer BL may include a glass substrate, a metal substrate, or an organic/inorganic composite substrate.

The circuit device layer DP-CL may include at least one insulating layer and at least one circuit device. Hereinafter, an insulating layer in the circuit device layer DP-CL will be referred to as an intermediate insulating layer. The intermediate insulating layer may include at least one intermediate inorganic layer and/or at least one intermediate organic layer. The circuit device may include signal lines, pixel driving circuits, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and etching process.

The display device layer DP-OLED may include a light emitting element. The display device layer DP-OLED may include organic light emitting diodes, which are used as the light emitting element. The display device layer DP-OLED may include a pixel definition layer, which is formed of or includes an organic material.

The upper insulating layer TFL may include a thin encapsulation layer, which is used to seal the circuit device layer DP-CL, as will be described below. The upper insulating layer TFL may further include functional layers (e.g., a capping layer, an anti-reflection layer, or a refractive index control layer).

As shown in FIG. 3B, the display panel DP may include a display region DP-DA and a non-display region DP-NDA, when viewed in a plan view. In the present exemplary embodiment, the non-display region DP-NDA may be defined along a border of the display region DP-DA. The display region DP-DA and the non-display region DP-NDA of the display panel DP may correspond to the display region DD-DA and the non-display region DD-NDA, respectively, of the display device DD of FIGS. 1, 2A, and 2B.

The display panel DP may include a driving circuit GDC, a plurality of signal lines SGL, and a plurality of pixels PX. The pixels PX may be provided in the display region DP-DA. Each of the pixels PX may include a light emitting element and a pixel driving circuit connected thereto. The driving circuit GDC, the signal lines SGL, and the pixel driving circuit may be included in the circuit device layer DP-CL shown in FIG. 3A.

The driving circuit GDC may include a scan driving circuit. The scan driving circuit may be configured to generate a plurality of scan signals and to sequentially output the scan signals to a plurality of scan lines GL to be described below. In addition, the scan driving circuit may be configured to output other control signals to a driving circuit of the pixel PX.

The scan driving circuit may include a plurality of thin-film transistors, which are formed by the same method as that for the driving circuit of the pixels PX or for example by a low-temperature polycrystalline silicon (LTPS) or low-temperature polycrystalline oxide (LTPO) process.

The signal lines SGL may include scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may be used to provide control signals to the scan driving circuit.

The signal lines SGL may be connected to a circuit board (not shown). For example, the signal lines SGL may be connected to a timing control circuit, which is provided in the form of an integrated circuit (IC) chip mounted on the circuit board. In an exemplary embodiment, the IC chip may be provided on the non-display region DP-NDA and may be connected to the signal lines SGL.

FIG. 3C illustrates a scan line GL, a data line DL, a power line PL, and a pixel PX connected thereto. The structure of the pixel PX is not limited to the example of FIG. 3C and may be variously changed.

An organic light emitting diode OLED, which may be a top-emission type diode or a bottom-emission type diode, may be provided. The pixel PX may include a first or switching transistor T1, a second or driving transistor T2, and a capacitor Cst, which are used as parts of a pixel driving circuit for driving the organic light emitting diode OLED. A first power voltage ELVDD may be provided to the second transistor T2, and a second power voltage ELVSS may be provided to the organic light emitting diode OLED. The second power voltage ELVSS may be lower than the first power voltage ELVDD.

The first transistor T1 may be configured to output a data signal applied to the data line DL, in response to a scan signal applied to the scan line GL. The capacitor Cst may be charged to a voltage corresponding to a data signal received from the first transistor T1. The second transistor T2 may be connected to the organic light emitting diode OLED. The second transistor T2 may be used to control a driving current flowing through the organic light emitting diode OLED, in response to an amount of electric charges stored in the capacitor Cst.

The structure of the pixel PX is not limited to the equivalent circuit diagram of FIG. 3C. For example, the pixel PX may be configured to include a plurality of transistors (e.g., seven or eight transistors). In addition, the pixel PX may be configured to include two or more capacitors. In an exemplary embodiment, the organic light emitting diode OLED may be provided between and coupled to the power line PL and the second transistor T2.

Each of FIGS. 3D and 3E illustrate a portion of the display panel DP, whose pixels are configured to have the same circuit structure as the equivalent circuit shown in FIG. 3C. Hereinafter, the display panel DP will be described in more detail with reference to FIG. 3D.

The circuit device layer DP-CL, the display device layer DP-OLED, and the upper insulating layer TFL may be sequentially provided on the base layer BL. In the present exemplary embodiment, the circuit device layer DP-CL may include a buffer layer BFL, a first intermediate inorganic layer 10, and a second intermediate inorganic layer 20, which are formed of inorganic materials, and an intermediate organic layer 30, which is formed of an organic material. The inorganic and organic materials are not limited to specific materials. In an exemplary embodiment, the buffer layer BFL may be selectively provided or may be omitted.

A semiconductor pattern OSP1 (hereinafter, a first semiconductor pattern) of the first transistor T1 and a semiconductor pattern OSP2 (hereinafter, a second semiconductor pattern) of the second transistor T2 may be provided on the buffer layer BFL. The first and second semiconductor patterns OSP1 and OSP2 may be formed of or include at least one of amorphous silicon, poly silicon, or metal oxide semiconductor materials.

The first intermediate inorganic layer 10 may be provided on the first semiconductor pattern OSP1 and the second semiconductor pattern OSP2. A control electrode GE1 (hereinafter, a first control electrode) of the first transistor T1 and a control electrode GE2 (hereinafter, a second control electrode) of the second transistor T2 may be provided on the first intermediate inorganic layer 10. The first control electrode GE1 and the second control electrode GE2 may be fabricated by the same photolithography process as that for the scan lines GL (e.g., see FIG. 3B).

The second intermediate inorganic layer 20 may be provided on the first intermediate inorganic layer 10 to cover the first control electrode GE1 and the second control electrode GE2. An input electrode DE1 and an output electrode SE1 (hereinafter, a first input electrode and a first output electrode) of the first transistor T1 and an input electrode DE2 and an output electrode SE2 (hereinafter, a second input electrode and a second output electrode) of the second transistor T2 may be provided on the second intermediate inorganic layer 20.

The first input electrode DE1 and the first output electrode SE1 may be respectively connected to the first semiconductor pattern OSP1 through a first penetration hole CH1 and a second penetration hole CH2, which are formed to penetrate the first intermediate inorganic layer 10 and the second intermediate inorganic layer 20. The second input electrode DE2 and the second output electrode SE2 may be respectively connected to the second semiconductor pattern OSP2 through a third penetration hole CH3 and a fourth penetration hole CH4, which are formed to penetrate the first intermediate inorganic layer 10 and the second intermediate inorganic layer 20. In an exemplary embodiment, at least one of the first transistor T1 and the second transistor T2 may be provided to have a bottom gate structure.

The intermediate organic layer 30 may be provided on the second intermediate inorganic layer 20 to cover the first input electrode DE1, the second input electrode DE2, the first output electrode SE1, and the second output electrode SE2. The intermediate organic layer 30 may be provided to have a flat surface (e.g., a flat top surface).

The display device layer DP-OLED may be provided on the intermediate organic layer 30. The display device layer DP-OLED may include a pixel definition layer PDL and the organic light emitting diode OLED. A first electrode AE may be provided on the intermediate organic layer 30. The first electrode AE may be connected to the second output electrode SE2 through a fifth penetration hole CH5 penetrating the intermediate organic layer 30. An opening OP may be defined in the pixel definition layer PDL. The opening OP of the pixel definition layer PDL may be formed to expose at least a portion of the first electrode AE. Hereinafter, the opening exposing the first electrode AE will be referred to as a light-emitting opening, for a clear distinction from other openings.

As shown in FIG. 3D, the pixel definition layer PDL may be divided into two distinguishable portions. For example, the pixel definition layer PDL may include a first portion PDL-1, in which the light-emitting opening OP exposing the first electrode AE is defined, and a second portion PDL-2, which is provided on and partially overlapped with the first portion PDL-1. In other words, the first portion PDL-1 and the second portion PDL-2 may be two portions that are distinguished from each other in the third direction DR3. The first portion PDL-1 may be in contact with the intermediate organic layer 30, and in the present exemplary embodiment, the intermediate organic layer 30 may be defined as a base insulating layer.

Meanwhile, the pixel definition layer PDL may also be divided into two portions, when viewed in a plan view. For example, as shown in FIG. 3E, when viewed in the second direction DR2, the pixel definition layer PDL may include a first portion PDL-10, in which the light-emitting opening OP exposing the first electrode AE is defined, and a second portion PDL-20, which is located adjacent to the first portion PDL-10 and is thicker than the first portion PDL-10.

A thickness TH1 of the first portion PDL-10 may be about 40% to 60% (e.g., 50%) of a thickness TH2 of the second portion PDL-20. The thickness TH2 may be a vertical length of the second portion PDL-20, which is measured at a center region of the second portion PDL-20.

The two portions of the pixel definition layer PDL described with reference to FIGS. 3D and 3E may be formed using a halftone mask. For example, the formation of the pixel definition layer PDL may include forming a preliminary pixel definition layer and removing a portion of the preliminary pixel definition layer in the thickness direction. The two portions, which are formed using the halftone mask, may have a single body shape.

A method of fabricating the pixel definition layer PDL is not limited to the method using the halftone mask. In an exemplary embodiment, the formation of the pixel definition layer PDL may include forming an insulating layer, which corresponds to the first portion PDL-1 of FIG. 3D, and then forming a spacer, which corresponds to the second portion PDL-2, using a printing method. In this case, there may be an interface between the two portions of the pixel definition layer PDL.

The display region DP-DA of FIG. 3B may include a light-emitting region PXA and a non-light-emitting region NPXA, which is located adjacent to the light-emitting region PXA, similar to the structure shown in FIGS. 3D and 3E. The non-light-emitting region NPXA may be provided to surround the light-emitting region PXA. In the present exemplary embodiment, the light-emitting region PXA may be defined to correspond to a portion of the first electrode AE exposed by the light-emitting opening OP.

In an exemplary embodiment, the light-emitting region PXA may be overlapped with at least one of the first and second transistors T1 and T2. At this exemplary embodiment, the light-emitting opening OP may be wider than that shown in FIGS. 3D and 3E. The first electrode AE and the light emitting layer EML described later may also be widened corresponding to the light-emitting opening OP.

A hole control layer HCL may be provided in both of the light-emitting region PXA and the non-light-emitting region NPXA. A common layer, such as the hole control layer HCL, may be provided in common in the pixels PX (e.g., see FIG. 3B). The hole control layer HCL may include a hole transport layer and, in an exemplary embodiment, the hole control layer HCL may further include a hole injection layer.

The light emitting layer EML may be provided on the hole control layer HCL. The light emitting layer EML may be provided on a region corresponding to the light-emitting opening OP. In other words, the light emitting layer EML may include a plurality of isolated patterns, each of which is provided for a corresponding one of the pixels PX. The light emitting layer EML may be formed of or include at least one of organic or inorganic materials. The light emitting layer EML may be configured to generate a specific color light.

An electron control layer ECL may be provided on the light emitting layer EML. The electron control layer ECL may also be provided in the pixels PX (e.g., see FIG. 3B). The electron control layer ECL may include an electron transport layer, and in an exemplary embodiment, the electron control layer ECL may further include an electron injection layer. A second electrode CE may be provided on the electron control layer ECL. The second electrode CE may be provided in common in the pixels PX.

The upper insulating layer TFL may be provided on the second electrode CE. The upper insulating layer TFL may include a plurality of thin films. For example, as shown in FIG. 3D, the upper insulating layer TFL may include a thin encapsulation layer TFE and a capping layer CPL, which are different from each other in terms of their functions.

In the present exemplary embodiment, the thin encapsulation layer TFE may be provided to be fully overlapped with the display region DP-DA of FIGS. 3A and 3B. The thin encapsulation layer TFE may be used to hermetically seal the organic light emitting diode OLED provided on the display region DP-DA. The thin encapsulation layer TFE may not be provided on the non-display region DP-NDA or may be provided on only a portion of the non-display region DP-NDA.

The thin encapsulation layer TFE may include at least one insulating layer. In an exemplary embodiment, the thin encapsulation layer TFE may include at least one inorganic layer (hereinafter, an encapsulation inorganic layer). In an exemplary embodiment, the thin encapsulation layer TFE may include at least one organic layer (hereinafter, an encapsulation organic layer) and at least one encapsulation inorganic layer.

The encapsulation inorganic layer may be used to protect the display device layer DP-OLED from moisture or oxygen, and the encapsulation organic layer may be used to protect the display device layer DP-OLED from a contamination material such as dust particles. The encapsulation inorganic layer may include at least one of a silicon nitride layer, a silicon oxynitride layer, a silicon oxide layer, a titanium oxide layer, or an aluminum oxide layer, but the inventive concepts are not limited thereto. The encapsulation organic layer may include an acrylic organic layer, but the inventive concepts are not limited thereto.

In an exemplary embodiment, the thin encapsulation layer TFE may include a silicon oxynitride layer, an organic monomer layer, and a silicon nitride layer, which are sequentially stacked on the second electrode CE. The thin encapsulation layer TFE may further include a lithium fluoride layer, which is provided between the second electrode CE and a silicon oxynitride layer.

The capping layer CPL may be provided to cover the display region DP-DA and the non-display region DP-NDA. The capping layer CPL may hermetically seal the thin encapsulation layer TFE. In the case where the thin encapsulation layer TFE is provided to cover the whole display region DP-DA and the non-display region DP-NDA, the capping layer CPL may be omitted.

In an exemplary embodiment, the organic light emitting diode OLED may further include a resonance structure, which is used to control a resonance distance of light emitted from the light emitting layer EML. The resonance structure may be provided between the first electrode AE and the second electrode CE, and a thickness of the resonance structure may be determined, based on a wavelength of light to be emitted from the light emitting layer EML.

Figure 4A:
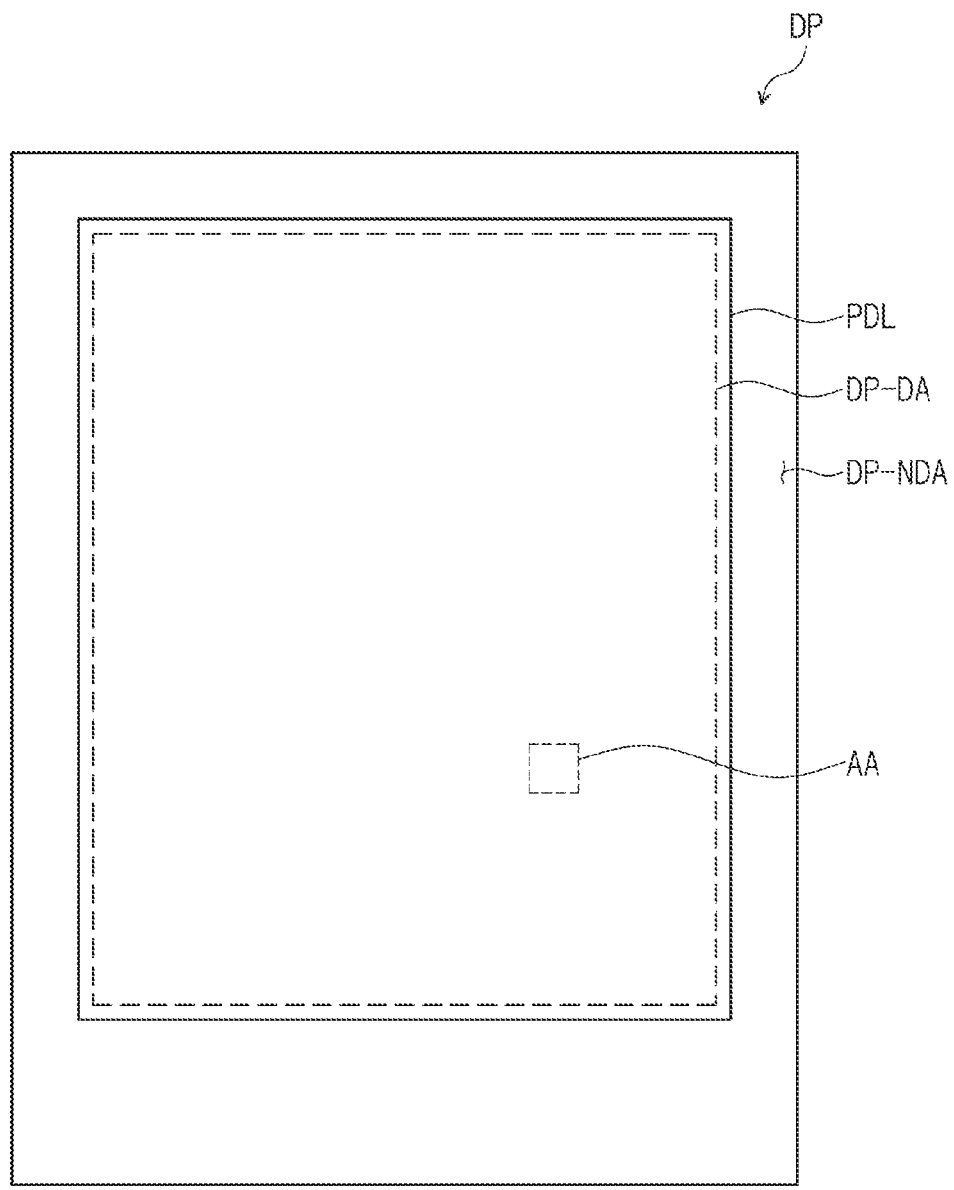
FIG. 4A is a plan view illustrating a display panel, in a specific step of a fabrication process according to an exemplary embodiment.
Figure 4B:
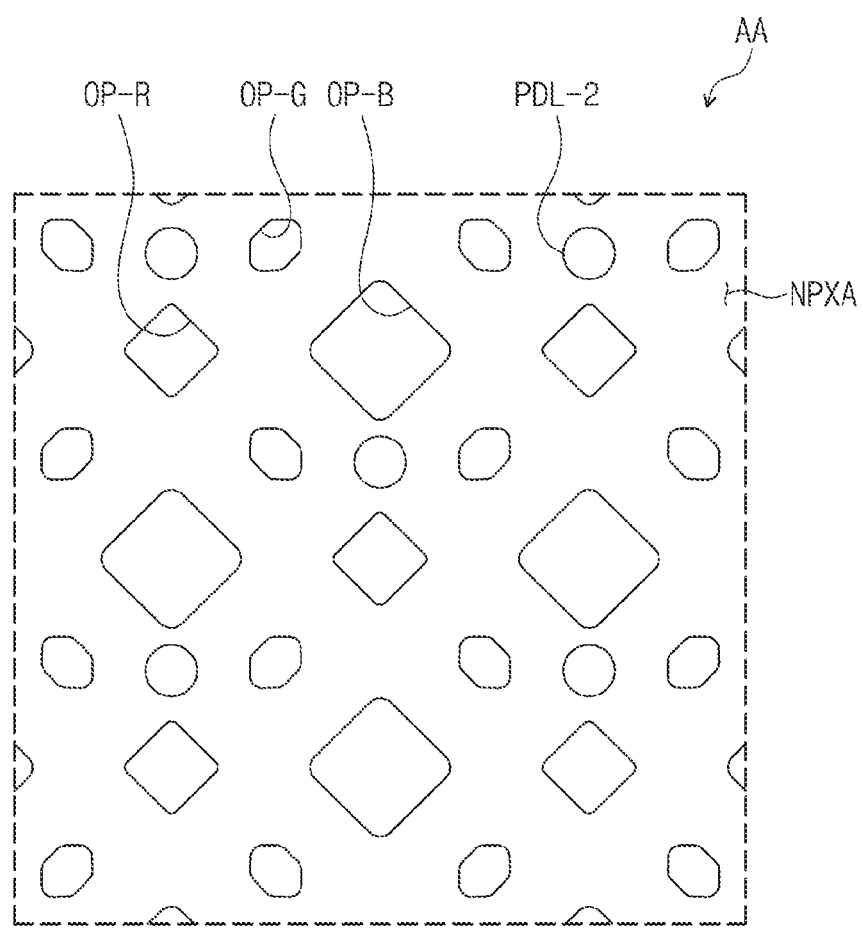
FIG. 4B is an enlarged plan view illustrating the display panel of FIG. 4A.
Figure 4C:
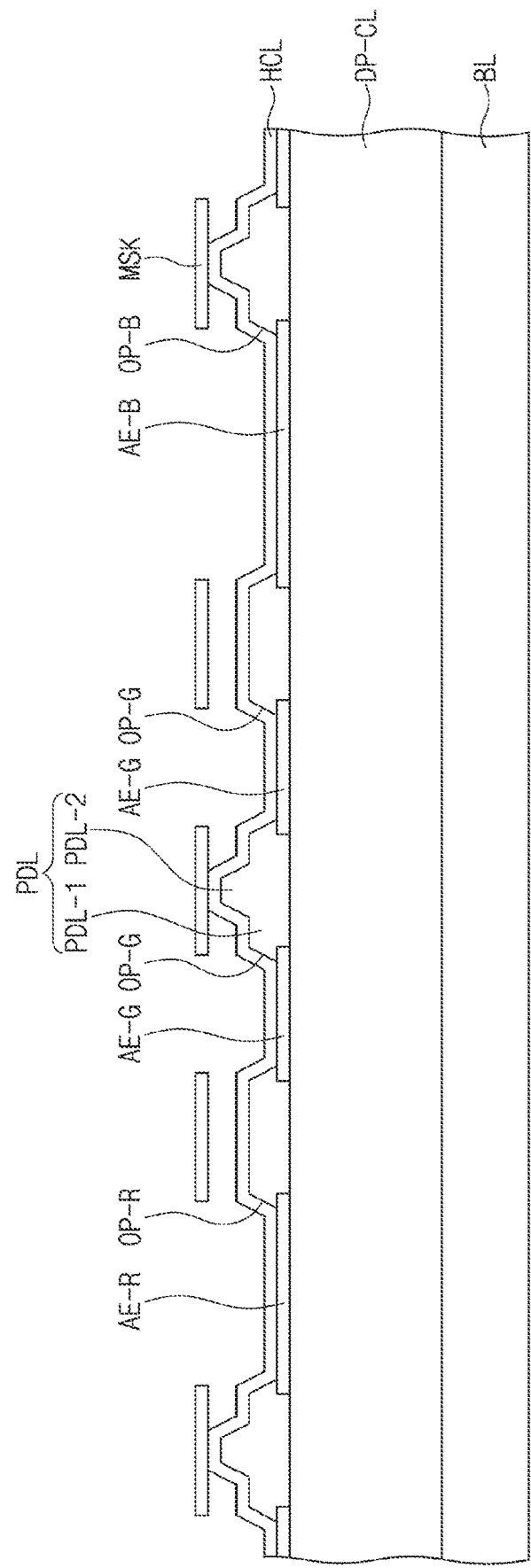
FIG. 4C is a cross-sectional view illustrating a display panel, in a specific step of a fabrication process according to an exemplary embodiment.

FIG. 4A is a plan view illustrating the display panel DP in a specific step of a fabrication process according to an exemplary embodiment. FIG. 4B is an enlarged plan view illustrating the display panel DP of FIG. 4A. FIG. 4C is a cross-sectional view illustrating the display panel DP in a specific step of a fabrication process according to an exemplary embodiment. Hereinafter, the pixel definition layer PDL of FIGS. 3D and 3E will be described in more detail with reference to FIGS. 4A to 4C.

As shown in FIG. 4A, the pixel definition layer PDL may be overlapped with the entire region of the display region DP-DA. As described with reference to FIGS. 3D and 3E, an organic layer may be formed on the intermediate organic layer 30 and may be patterned through a photolithography process. As a result, the pixel definition layer PDL, which is divided into two portions and has a plurality of light-emitting opening, may be formed.

FIG. 4B shows an enlarged shape of a region 'AA' of FIG. 4A. As shown in FIG. 4B, three types of light-emitting openings may be formed in the pixel definition layer PDL. The light-emitting openings may be classified into a first light-emitting opening OP-G, a second light-emitting opening OP-R, and a third light-emitting opening OP-B. An area of each of the first, second, and third light-emitting openings OP-G, OP-R, and OP-B may be proportional to a light emitting area of a corresponding pixel.

The pixels PX of FIG. 3B may include green, red, and blue pixels, which are configured to emit green, red, and blue lights, respectively. In the present exemplary embodiment, the first, second, and third light-emitting openings OP-G, OP-R, and OP-B may correspond to the light emitting elements of the green, red, and blue pixels, respectively.

As shown in FIG. 4B, when viewed in a plan view, the second portion PDL-2 may be provided at a region (hereinafter, a spacer region), which is enclosed by two first light-emitting openings OP-G, one second light-emitting opening OP-R, and one third light-emitting opening OP-B. In an exemplary embodiment, a plurality of spacer regions may be defined in the pixel definition layer PDL, and the second portions PDL-2 may be provided at some of the spacer regions.

The shape of the second portion PDL-2 may be variously changed. For example, when viewed in a plan view, the second portion PDL-2 may have a circular, rectangular, or square shape. A length of a side (or a diameter) of the second portion PDL-2 may range from about 10 μm to about 25 μm. In this case, the second portion PDL-2 may meet functional requirement for a spacer to be described below. When viewed in a plan view, the second portion PDL-2 may be spaced apart from the first, second, and third light-emitting openings OP-G, OP-R, and OP-B by a distance of about 5-10 μm.

As shown in FIG. 4C, the second portion PDL-2 may support a mask MSK. The mask MSK may be used in a subsequent process of depositing the light emitting layer EML of FIGS. 3D and 3E. In an exemplary embodiment, the mask MSK may be in contact with the hole control layer HCL provided on the second portion PDL-2. In the process of depositing the light emitting layer EML, the second portion PDL-2 may be used to support the mask MSK, and thus, it may be possible to prevent active regions of the hole control layer HCL corresponding to the first, second, and third light-emitting openings OP-G, OP-R, and OP-B from being in contact with the mask MSK. That is, the second portion PDL-2 may be used as the spacer supporting the mask MSK.

As shown in FIG. 4C, a first-type first electrode AE-G, a second-type first electrode AE-R, and a third-type first electrode AE-B may be provided at regions corresponding to the first, second, and third light-emitting openings OP-G, OP-R, and OP-B, respectively. The first-type first electrode AE-G may have a first area, the second-type first electrode AE-R may have a second area larger than the first area, and the third-type first electrode AE-B may have a third area larger than the second area. A light emitting area of each pixel may be proportional to an area of a corresponding one of the first-, second-, and third-type first electrodes AE-G, AE-R, and AE-B.

Figure 5A:
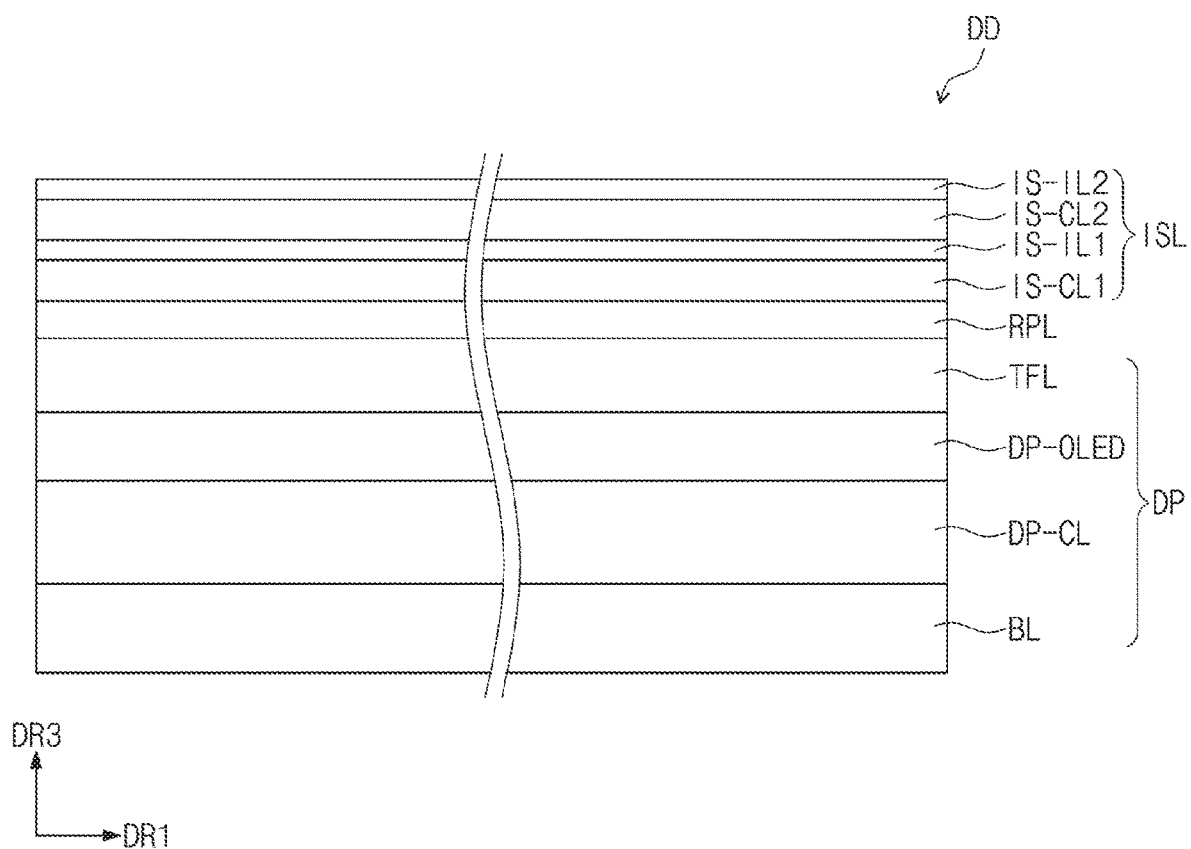
FIG. 5A is a cross-sectional view illustrating a display device according to an exemplary embodiment.
Figure 5B:
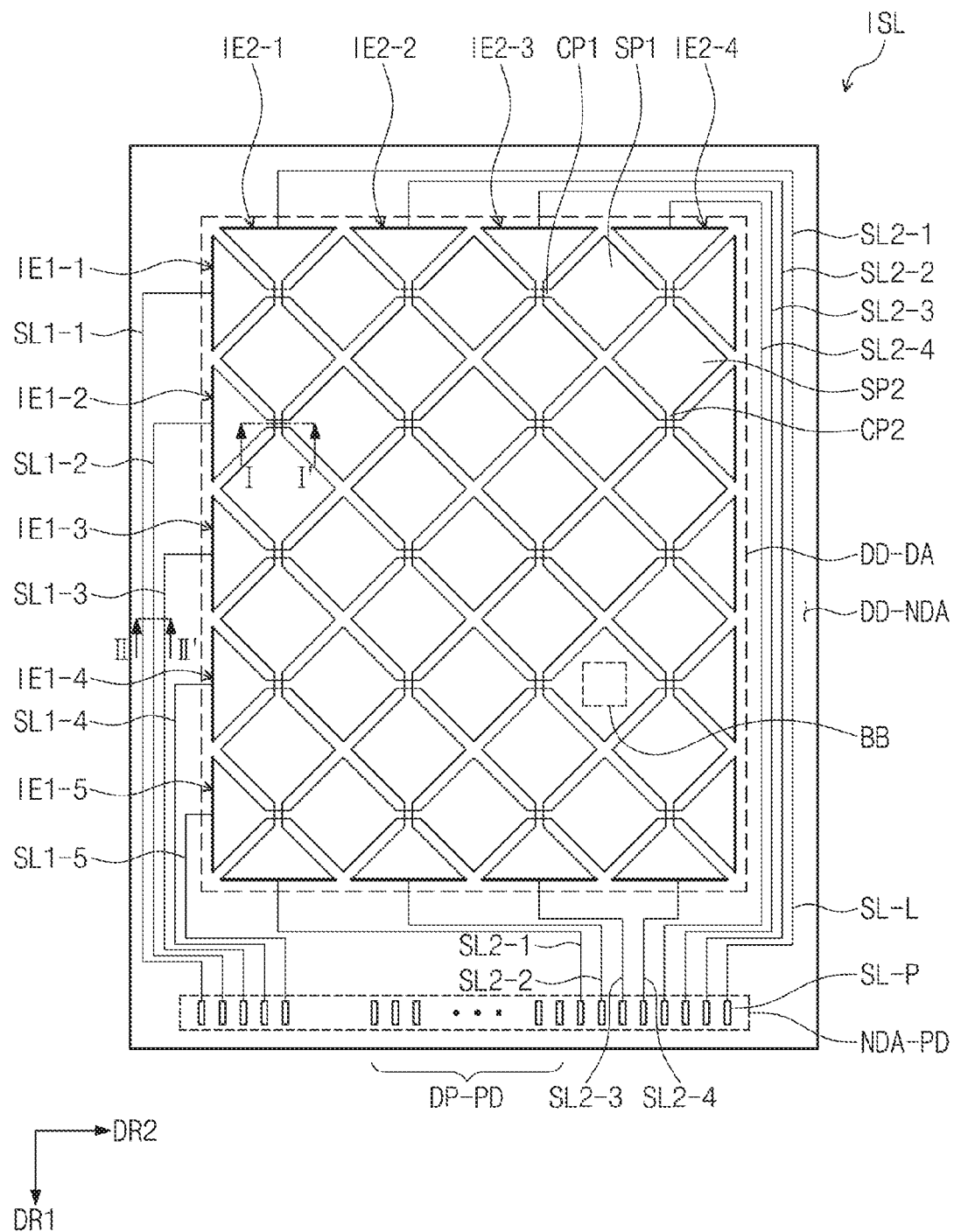
FIG. 5B is a plan view illustrating an input-sensing layer according to an exemplary embodiment.
Figure 5C:
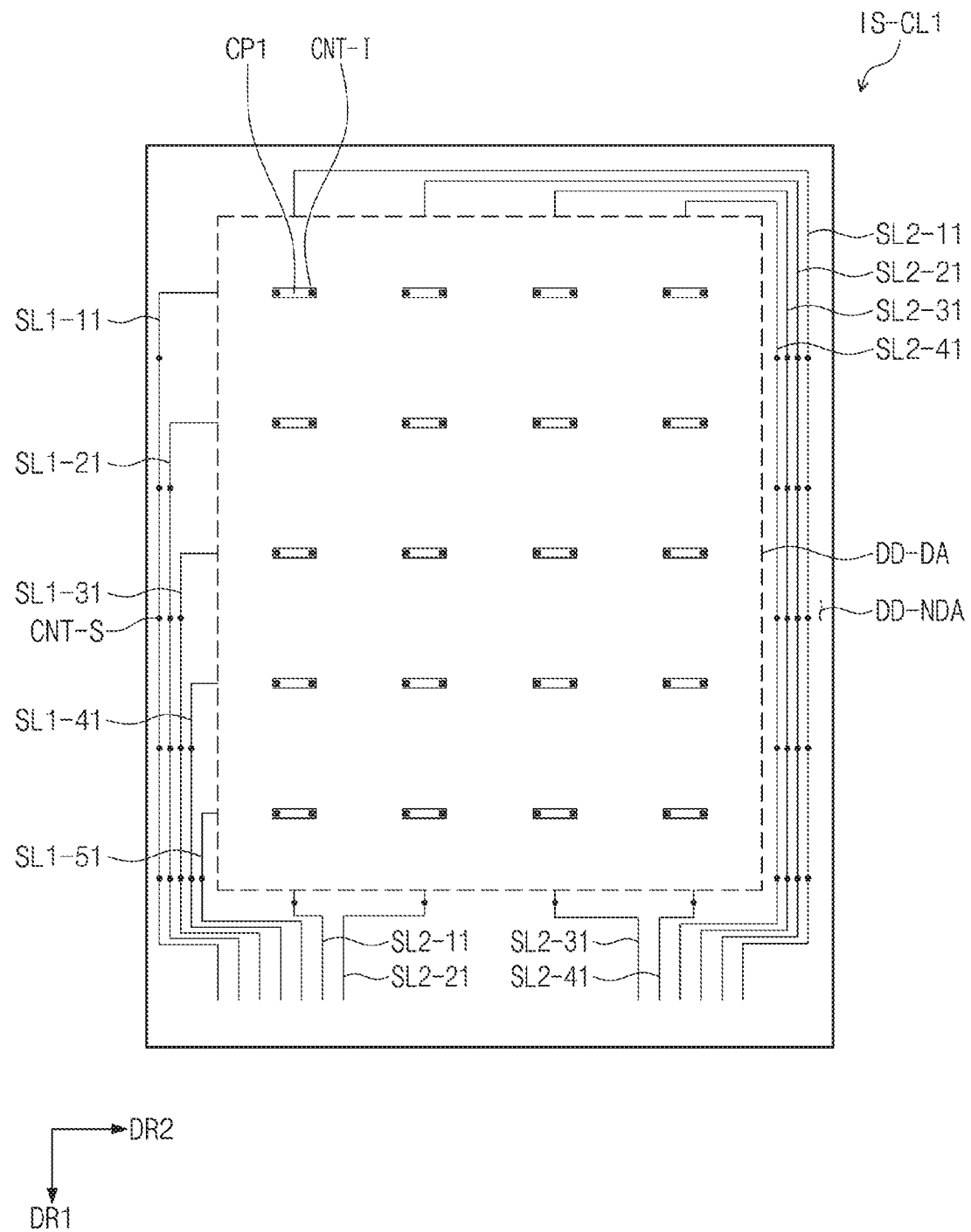
FIG. 5C is a plan view illustrating a first conductive layer of an input-sensing layer according to an exemplary embodiment.
Figure 5D:
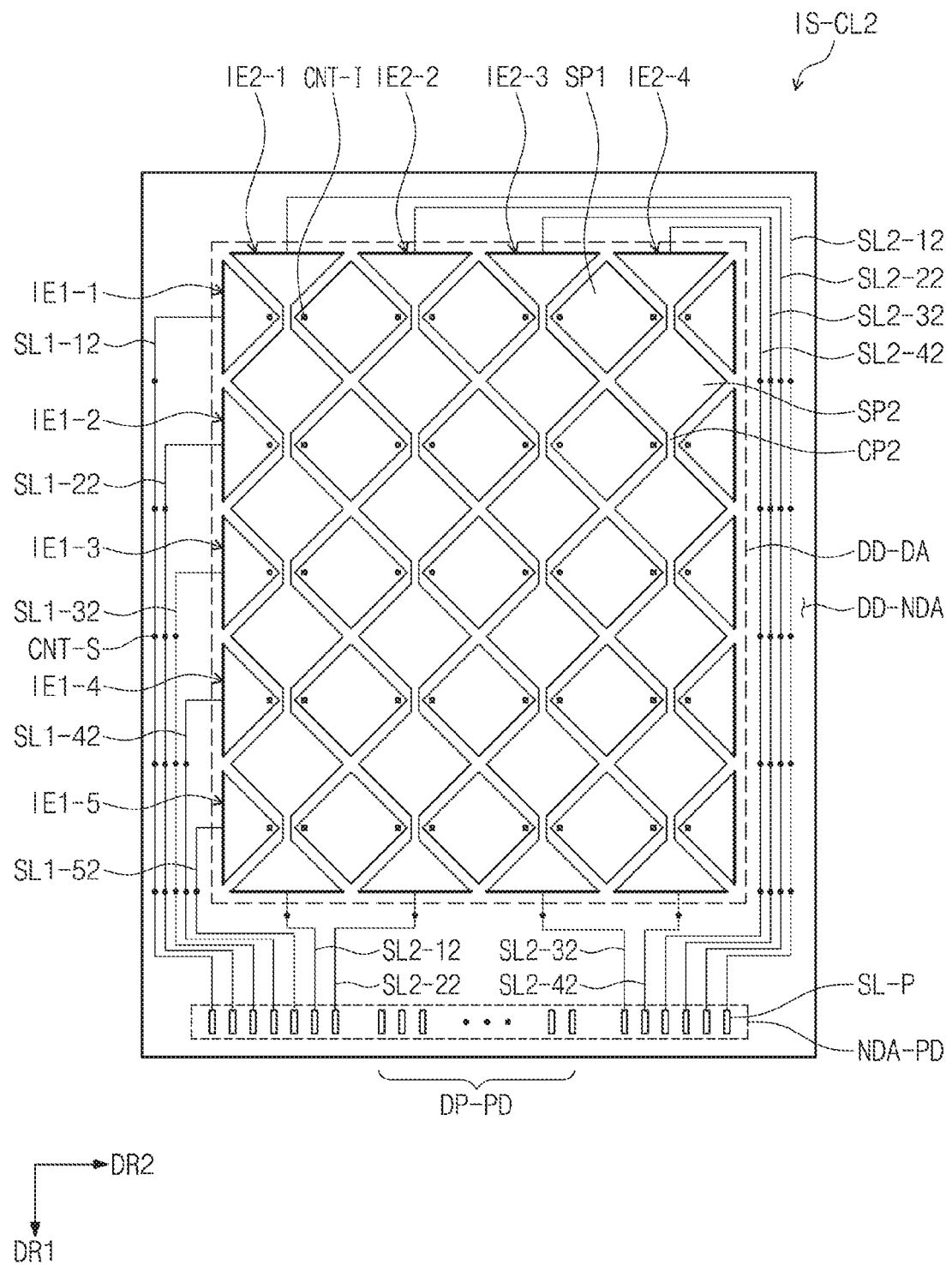
FIG. 5D is a plan view illustrating a second conductive layer of an input-sensing layer according to an exemplary embodiment.
Figure 5E:
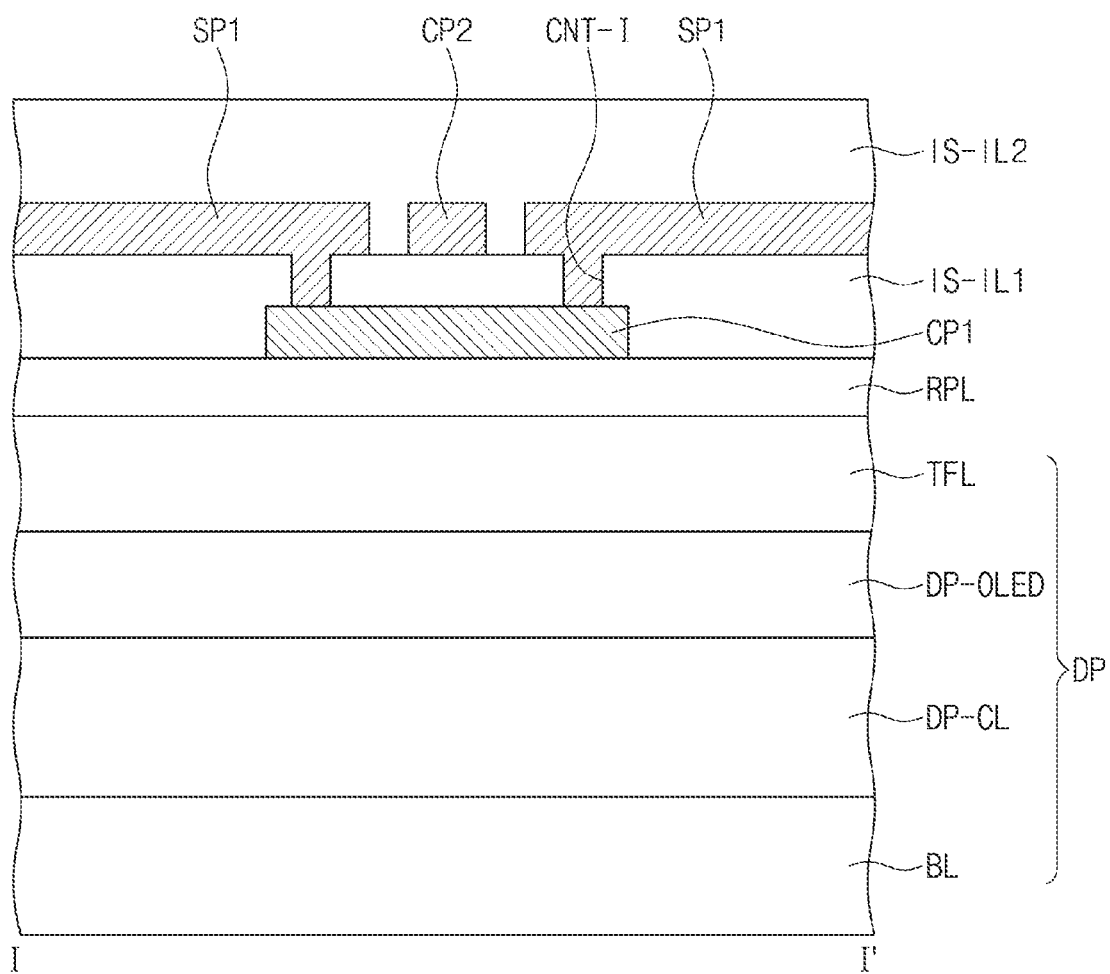
FIGS. 5E and 5F are cross-sectional views each illustrating a portion of an input-sensing layer according to an exemplary embodiment.
Figure 5F:
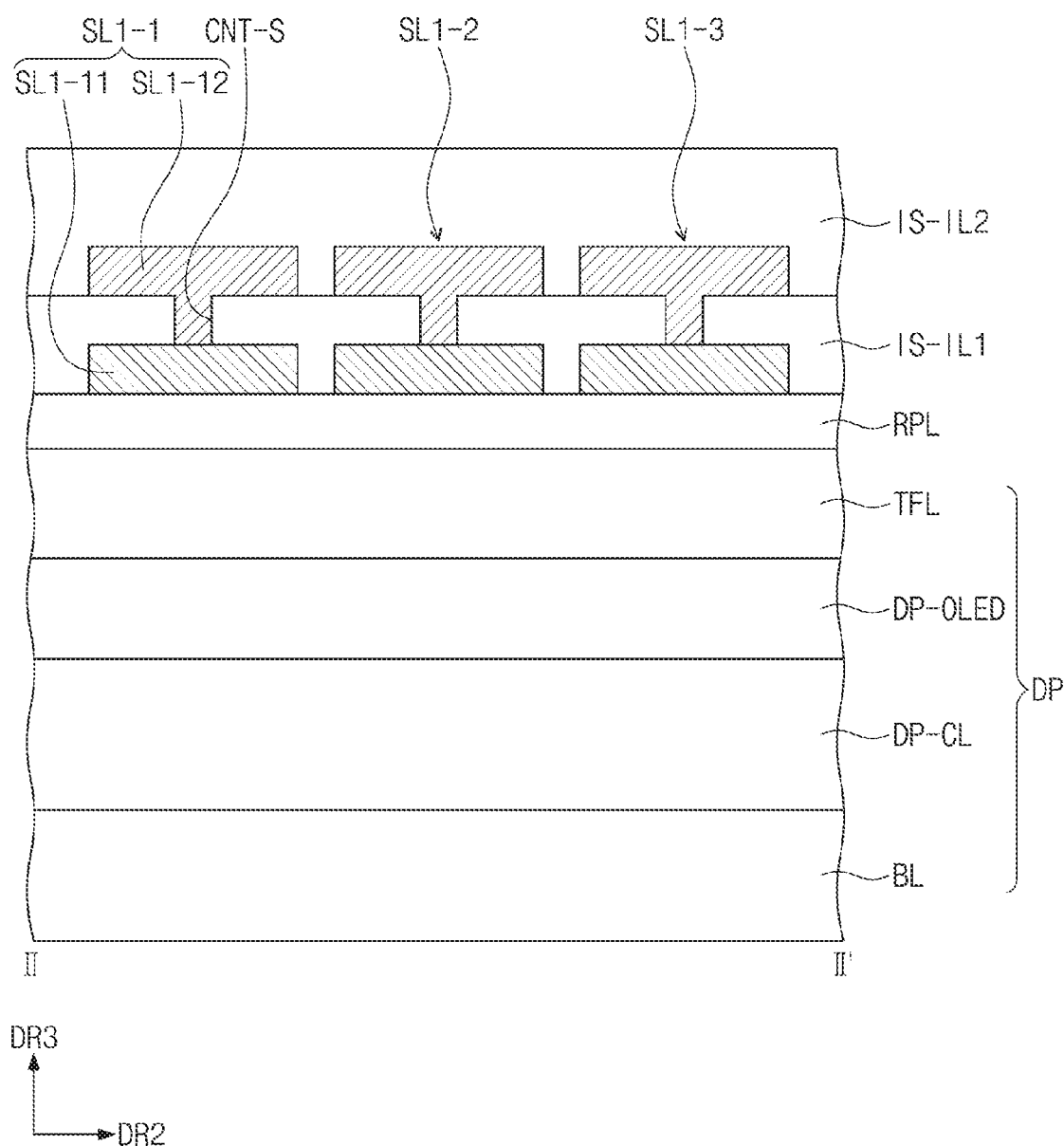

FIG. 5A is a cross-sectional view illustrating the display device DD according to an exemplary embodiment. FIG. 5B is a plan view illustrating the input-sensing layer ISL according to an exemplary embodiment. FIG. 5C is a plan view illustrating a first conductive layer IS-CL1 of the input-sensing layer ISL according to an exemplary embodiment. FIG. 5D is a plan view illustrating a second conductive layer IS-CL2 of the input-sensing layer ISL according to an exemplary embodiment. FIGS. 5E and 5F are cross-sectional views each illustrating a portion of the input-sensing layer ISL according to an exemplary embodiment.

In FIG. 5A, to provide better understanding of a stacking structure of the input-sensing layer ISL, the display panel DP and the anti-reflection layer RPL are illustrated in a simplified manner. An anti-reflection unit and a window unit may be provided on the input-sensing layer ISL.

The input-sensing layer ISL may include at least one sensing electrode. The input-sensing layer ISL may further include a signal line, which is connected to the sensing electrode, and at least one insulating layer. The input-sensing layer ISL may be configured to sense an external input in, for example, a capacitance-sensing manner. However, the inventive concepts are not limited to a specific sensing method of the input-sensing layer ISL, and in an exemplary embodiment, the input-sensing layer ISL may be configured to sense an external input in an electromagnetic induction manner or in a pressure-sensing manner.

In an exemplary embodiment, as shown in FIG. 5A, the input-sensing layer ISL may include a first conductive layer IS-CL1, a first insulating layer IS-IL1, a second conductive layer IS-CL2, and a second insulating layer IS-IL2. Each of the first and second conductive layers IS-CL1 and IS-CL2 may have a single-layered structure or a multi-layered structure including a plurality of layers stacked in the third direction DR3. In the case where one or both of the first and second conductive layers IS-CL1 and IS-CL2 have the single-layered structure may include a metal layer or a transparent conductive layer. The metal layer may be formed of or include at least one of molybdenum, silver, titanium, copper, aluminum, or alloys thereof. The transparent conductive layer may be formed of or include at least one of transparent conductive oxides, such as indium tin oxide (ITO), indium zinc oxide (IZO), zinc oxide (ZnO), or indium tin zinc oxide (ITZO). In an exemplary embodiment, the transparent conductive layer may include a conductive polymer (e.g., PEDOT), metal nanowires, or graphene.

In the case where one or both of the first and second conductive layers IS-CL1 and IS-CL2 have the multi-layered structure may include a plurality of metal layers. For example, the conductive layer having the multi-layered structure may be provided to have a triple-layered structure including a titanium layer, an aluminum layer, and a titanium layer. Alternatively, the conductive layer having the multi-layered structure may include at least one metal layer and at least one transparent conductive layer.

Each of the first and second conductive layers IS-CL1 and IS-CL2 may include a plurality of conductive patterns. In the following description, the conductive patterns in the first conductive layer IS-CL1 will be referred to as first conductive patterns, and the conductive patterns in the second conductive layer IS-CL2 will be referred to as second conductive patterns. Each of the first and second conductive patterns may include sensing electrodes and signal lines.

A stacking structure and a material of the sensing electrode may be determined in consideration of technical requirements on sensing sensitivity. The sensing sensitivity may be affected by RC delay, and here, since the metal layer has electric resistance lower than that of the transparent conductive layer, the sensing electrodes formed of the metal layer may have a reduced RC delay. Thus, it may be possible to reduce a charging time taken to charge a capacitor between the sensing electrodes. By contrast, in the case where the sensing electrodes include the transparent conductive layer, the sensing electrodes may be hardly recognized by a user, compared with the sensing electrodes formed of the metal layer. Furthermore, the sensing electrodes may be provided to have an increased input area, and this may make it possible to increase capacitance of the capacitor.

In an exemplary embodiment, the sensing electrodes may be provided to form a mesh structure, as will be described below, and in this case, it may be possible to prevent the sensing electrodes including the metal layer from being recognized by a user. A thickness of the upper insulating layer TFL may be adjusted to prevent the input-sensing layer ISL from being affected by noise caused by elements of the display device layer DP-OLED. Each of the first and second insulating layers IS-IL1 and IS-IL2 may be provided to have a single- or multi-layered structure. Each of the first and second insulating layers IS-IL1 and IS-IL2 may be formed of or include at least one of inorganic, organic, or composite materials.

At least one of the first and second insulating layers IS-IL1 and IS-IL2 may include an inorganic layer. The inorganic layer may be formed of or include at least one of aluminum oxide, titanium oxide, silicon oxide, silicon oxynitride, zirconium oxide, or hafnium oxide.

At least one of the first and second insulating layers IS-IL1 and IS-IL2 may include an organic layer. The organic layer may be formed of or include at least one of acrylic resins, methacryl resins, polyisoprene resins, vinyl resins, epoxy resins, urethane resins, cellulose resins, siloxane resins, polyimide resins, polyamide resins, or perylene resins.

As shown in FIG. 5B, the input-sensing layer ISL may include first sensing electrodes IE1-1 to 1E1-5, first signal lines SL1-1 to SL1-5 connected to the first sensing electrodes IE1-1 to 1E1-5, second sensing electrodes 1E2-1 to 1E2-4, and second signal lines SL2-1 to SL2-4 connected to the second sensing electrodes 1E2-1 to 1E2-4. The input-sensing layer ISL may include an optical dummy electrode, which is provided in a border region between the first sensing electrodes 1E1-1 to 1E1-5 and the second sensing electrodes 1E2-1 to 1E2-4.

The first sensing electrodes IE1-1 to 1E1-5 may be provided to intersect the second sensing electrodes 1E2-1 to 1E2-4. The first sensing electrodes IE1-1 to 1E1-5 may be arranged in the first direction DR1, and each of the first sensing electrodes 1E1-1 to 1E1-5 may extend in the second direction DR2. The first and second sensing electrodes IE1-1 to 1E1-5 and 1E2-1 to 1E2-4 may be configured to sense an external input in a mutual-capacitance manner and/or in a self-capacitance manner. In an exemplary embodiment, during a first period, coordinates of an external input may be calculated in the mutual-capacitance manner, and during a second period, the coordinates of the external input may be re-calculated in the self-capacitance manner.

Each of the first sensing electrodes IE1-1 to 1E1-5 may include first sensor portions SP1 and first connecting portions CP1. Each of the second sensing electrodes 1E2-1 to 1E2-4 may include second sensor portions SP2 and second connecting portions CP2. Two of the first sensor portions SP1, which are located at opposite ends of the first sensing electrode, may have a small area or size (e.g., half area), compared with a central one of the first sensor portions SP1. Two of the second sensor portions SP2, which are located at opposite ends of the second sensing electrode, may have a small area or size (e.g., half area), compared with a central one of the second sensor portions SP2.

The inventive concepts are not limited to the exemplary shapes of the first and second sensing electrodes IE1-1 to 1E1-5 and 1E2-1 to 1E2-4, which are shown in FIG. 5B. In an exemplary embodiment, each of the first and second sensing electrodes 1E1-1 to 1E1-5 and 1E2-1 to 1E2-4 may have a shape (e.g., a bar shape), which does not allow for a clear distinction between the sensor portion and the connecting portion. Although each of the first and second sensor portions SP1 and SP2 is illustrated to have a diamond shape, the inventive concepts are not limited thereto. For example, each of the first and second sensor portions SP1 and SP2 may have at least one of other polygonal shapes.

In each of the first sensing electrodes 1E1-1 to 1E1-5, the first sensor portions SP1 may be arranged in the second direction DR2, and in each of the second sensing electrodes 1E2-1 to 1E2-4, the second sensor portions SP2 may be arranged in the first direction DR1. Each of the first connecting portions CP1 may be provided to connect adjacent ones of the first sensor portions SP1 to each other, and each of the second connecting portions CP2 may be provided to connect adjacent ones of the second sensor portions SP2 to each other.

The first signal lines SL1-1 to SL1-5 may be connected to ends of the first sensing electrodes IE1-1 to 1E1-5, respectively. The second signal lines SL2-1 to SL2-4 may be connected to opposite ends of the second sensing electrodes 1E2-1 to 1E2-4. In an exemplary embodiment, the first signal lines SL1-1 to SL1-5 may also be connected to opposite ends of the first sensing electrodes IE1-1 to 1E1-5. In an exemplary embodiment, the second signal lines SL2-1 to SL2-4 may be connected to only one-side ends of the second sensing electrodes 1E2-1 to 1E2-4, respectively.

In the present exemplary embodiment, it may be possible to improve sensing sensitivity of the input-sensing layer ISL, compared with an input-sensing unit, in which the second signal lines SL2-1 to SL2-4 are connected to only one-side ends of the second sensing electrodes 1E2-1 to 1E2-4, respectively. In the present exemplary embodiment, since the second signal lines SL2-1 to SL2-4, which are connected to opposite ends of the second sensing electrodes 1E2-1 to 1E2-4, are used to transmit a detection or transmission signal, the equivalent resistance is lowered in a current path. In the current path defined from one of the second sensing electrodes 1E2-1 to 1E2-4 to one of the first sensing electrodes IE1-1 to 1E1-4, one second sensing electrode is two resistors are connected in parallel in an equivalent circuit. The equivalent resistance is lowered so that the voltage drop of the detection signal (or the transmission signal) can be prevented, thereby preventing a decrease in sensing sensitivity.

Each of the first and second signal lines SL1-1 to SL1-5 and SL2-1 to SL2-4 may include a line portion SL-L and a pad portion SL-P. The pad portions SL-P may be provided on a pad region NDA-PD to be aligned to each other. The input-sensing layer ISL may include signal pads DP-PD. The signal pads DP-PD may be provided on the pad region NDA-PD to be aligned to each other. The signal pads DP-PD may be overlapped with and connected to the pad portions of the signal lines SGL of FIG. 3B.

In an exemplary embodiment, the first signal lines SL1-1 to SL1-5 and the second signal lines SL2-1 to SL2-4 may be replaced with a circuit board, which is separately fabricated, or the like.

As shown in FIG. 5C, the first conductive layer IS-CL1 may include the first connecting portions CP1. In addition, the first conductive layer IS-CL1 may include first line portions SL1-11 to SL1-51 of the first signal lines SL1-1 to SL1-5 and first line portions SL2-11 to SL2-41 of the second signal lines SL2-1 to SL2-4.

The first connecting portions CP1, the first line portions SL1-11 to SL1-51 of the first signal lines SL1-1 to SL1-5, and the first line portions SL2-11 to SL2-41 of the second signal lines SL2-1 to SL2-4 may be formed by the same process. The first connecting portions CP1, the first line portions SL1-11 to SL1-51 of the first signal lines SL1-1 to SL1-5, and the first line portions SL2-11 to SL2-41 of the second signal lines SL2-1 to SL2-4 may be formed of the same material and may have the same stacking structure. The first connecting portions CP1 may be formed by a process different from that for the first line portions SL1-11 to SL1-51 of the first signal lines SL1-1 to SL1-5 and the first line portions SL2-11 to SL2-41 of the second signal lines SL2-1 to SL2-4. The first line portions SL1-11 to SL1-51 of the first signal lines SL1-1 to SL1-5 and the first line portions SL2-11 to SL2-41 of the second signal lines SL2-1 to SL2-4 may have the same stacking structure, and the first connecting portions CP1 may have a stacking structure different from those.

In an exemplary embodiment, the first conductive layer IS-CL1 may include the first connecting portions CP1 (e.g., see FIG. 5c). Here, the second connecting portions CP2 may be formed on the second conductive layer IS-CL2. Thus, each of the second sensing electrodes IE2-1 to IE2-4 may have a single body shape.

The first insulating layer IS-IL1 may be provided to cover at least the first connecting portions CP1. In the present exemplary embodiment, the first insulating layer IS-IL1 may be overlapped with at least a portion of the display and non-display regions DD-DA and DD-NDA. The first insulating layer IS-IL1 may be provided to cover the first line portions SL1-11 to SL1-51 of the first signal lines SL1-1 to SL1-5 and the first line portions SL2-11 to SL2-41 of the second signal lines SL2-1 to SL2-4.

In the present exemplary embodiment, the first insulating layer IS-IL1 may be overlapped with the display region DD-DA and the pad region NDA-PD. The first insulating layer IS-IL1 may be fully overlapped with the display and non-display regions DD-DA and DD-NDA. The first insulating layer IS-IL1 may be provided to define first connection contact holes CNT-I, which are formed to partially expose the first connecting portions CP1, and second connection contact holes CNT-S, which are formed to partially expose the first line portions SL1-11 to SL1-51 of the first signal lines SL1-1 to SL1-5 and the first line portions SL2-11 to SL2-41 of the second signal lines SL2-1 to SL2-4.

As shown in FIG. 5D, the second conductive layer IS-CL2 may include the first sensor portions SP1, the second sensor portions SP2, and the second connecting portions CP2. Each of the second sensing electrodes 1E2-1 to 1E2-4 may have a single body shape. The first sensor portions SP1 may be spaced apart from the second sensing electrodes 1E2-1 to 1E2-4.

The second conductive layer IS-CL2 may include second line portions SL1-12 to SL1-52 of the first signal lines SL1-1 to SL1-5, the pad portions SL-P of the first signal lines SL1-1 to SL1-5, second line portions SL2-12 to SL2-42 of the second signal lines SL2-1 to SL2-4, and the pad portions SL-P of the second signal lines SL2-1 to SL2-4. The second conductive layer IS-CL2 may include the signal pads DP-PD.

The first sensor portions SP1, the second sensor portions SP2, and the second connecting portions CP2 may be formed by the same process. The first sensor portions SP1, the second sensor portions SP2, and the second connecting portions CP2 may be formed of or include the same material and may have the same stacking structure. The second line portions SL1-12 to SL1-52 of the first signal lines SL1-1 to SL1-5, the pad portions SL-P of the first signal lines SL1-1 to SL1-5, the second line portions SL2-12 to SL2-42 of the second signal lines SL2-1 to SL2-4, the pad portions SL-P of the second signal lines SL2-1 to SL2-4, and the signal pads DP-PD may be formed by a process that is the same as or different from that for the first sensor portions SP1, the second sensor portions SP2, and the second connecting portions CP2.

The second insulating layer IS-IL2 may be overlapped with at least a portion of the display and non-display regions DD-DA and DD-NDA. In the present exemplary embodiment, the second insulating layer IS-IL2 may be provided to expose the pad region NDA-PD.

As shown in FIG. 5E, the first sensor portions SP1 may be electrically connected to the first connecting portion CP1 through the first connection contact holes CNT-I. The first connecting portion CP1 may be formed of or include a material having electric resistance lower than the first sensor portions SP1.

The first connecting portion CP1 may be provided to intersect the second connecting portion CP2, and in an exemplary embodiment, to reduce the effect of parasitic capacitance, the first connecting portion CP1 may be configured to have a reduced width, when measured in a horizontal direction. The first connecting portion CP1 may include a low resistance material (e.g., the same metallic material as the first line portions SL1-11 to SL1-51 of the first signal lines SL1-1 to SL1-5), and this may make it possible to improve the sensing sensitivity of the input-sensing layer ISL.

In the present exemplary embodiment, the first insulating layer IS-IL1 may be a polymer layer (e.g., an acrylic polymer layer). The second insulating layer IS-IL2 may also be a polymer layer (e.g., an acrylic polymer layer). The polymer layer may be configured to improve flexibility of the display device DD, even when the input-sensing layer ISL is directly provided on the display panel DP.

Three first signal lines SL1-1 to SL1-3 of the first signal lines SL1-1 to SL1-5 are exemplarily illustrated in FIG. 5F. As an example, in the case of the first signal line SL1-1, the first line portion SL1-11 and the second line portion SL1-12 may be electrically connected to each other through the second connection contact holes CNT-S. Thus, the first signal line SL1-1 may have a reduced resistance.

In an exemplary embodiment, one of the first and second line portions SL1-11 and SL1-12 may be omitted. One of the first and second line portions of the second signal lines SL2-1 to SL2-4 may be omitted.

The stacking order of the elements constituting the input-sensing layer ISL described with reference to FIGS. 5C to 5F may be changed. In an exemplary embodiment, the first sensor portions SP1 and the second connecting portion CP2 may be directly provided on the upper insulating layer TFL. The first insulating layer IS-IL1 may be provided on the upper insulating layer TFL to cover the first sensor portions SP1 and second connecting portion CP2. The first connecting portion CP1, which is provided on the first insulating layer IS-IL1, may be electrically connected to the first sensor portions SP1 through the first connection contact holes CNT-I.

Figure 6A:
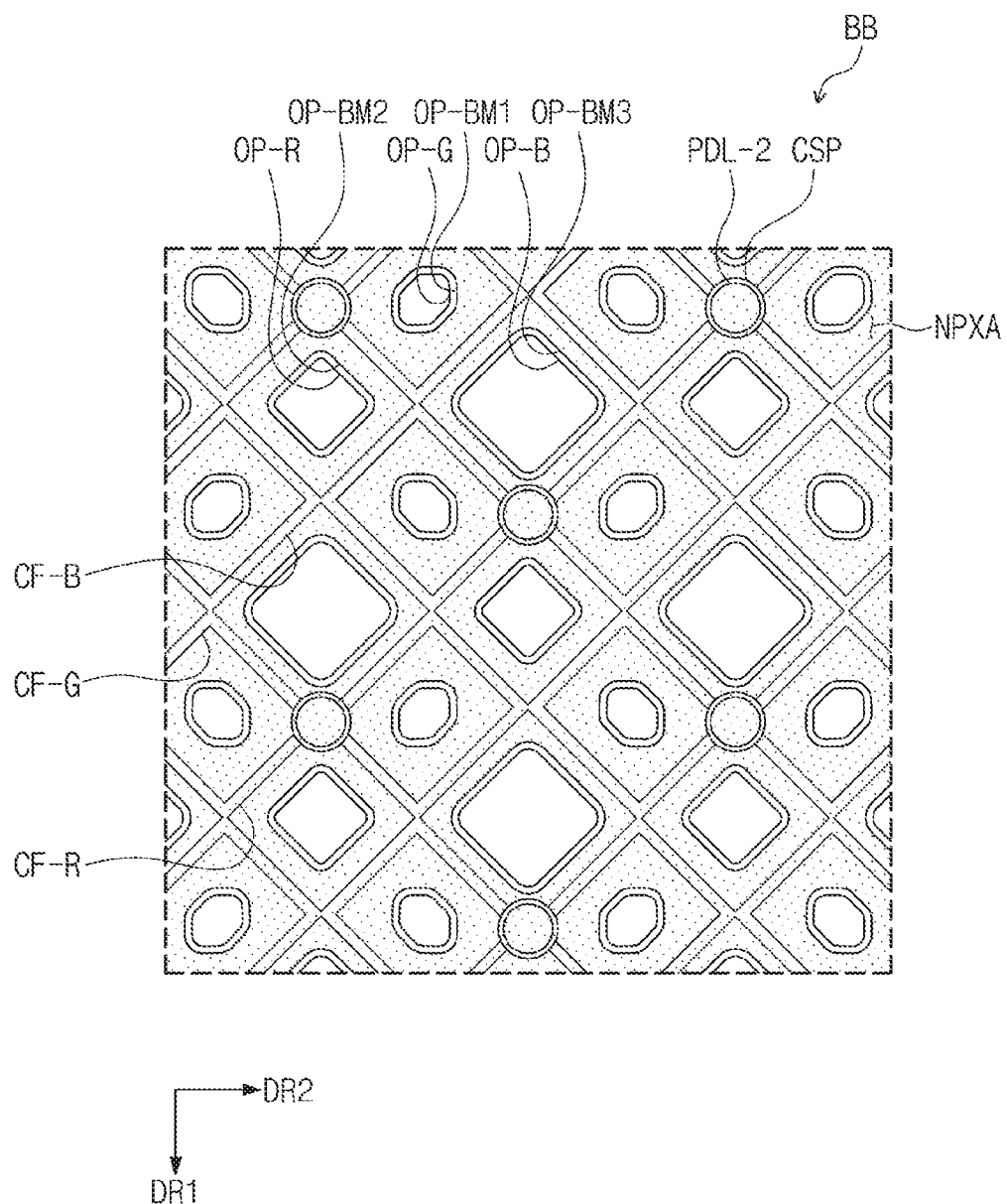
FIG. 6A is an enlarged plan view illustrating a display device according to an exemplary embodiment.
Figure 6B:
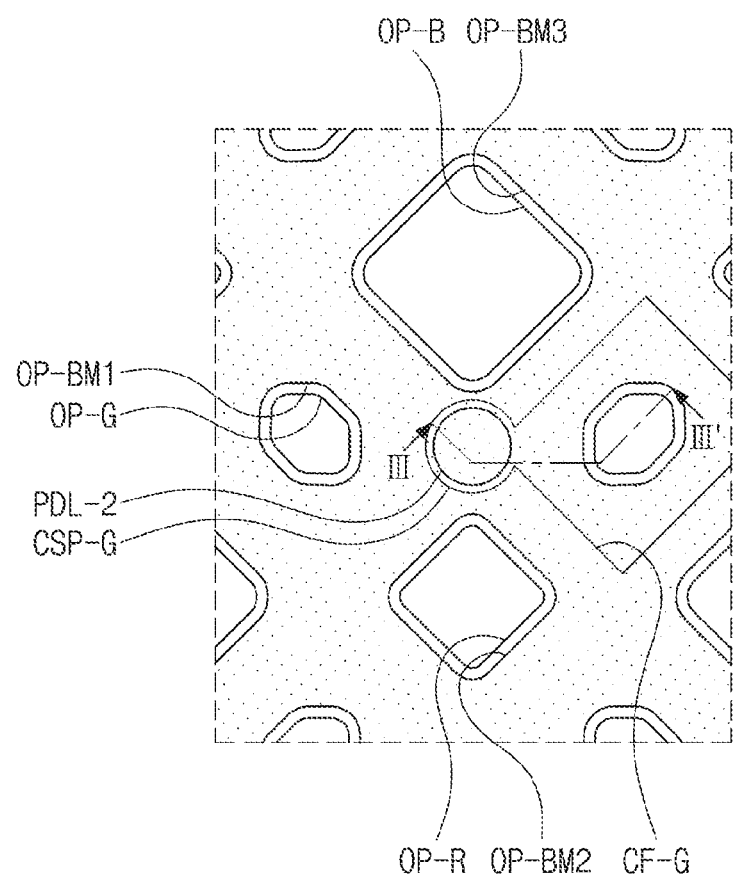
FIGS. 6B, 6C, and 6D are enlarged plan views each illustrating a portion of the display device of FIG. 6A.
Figure 6C:
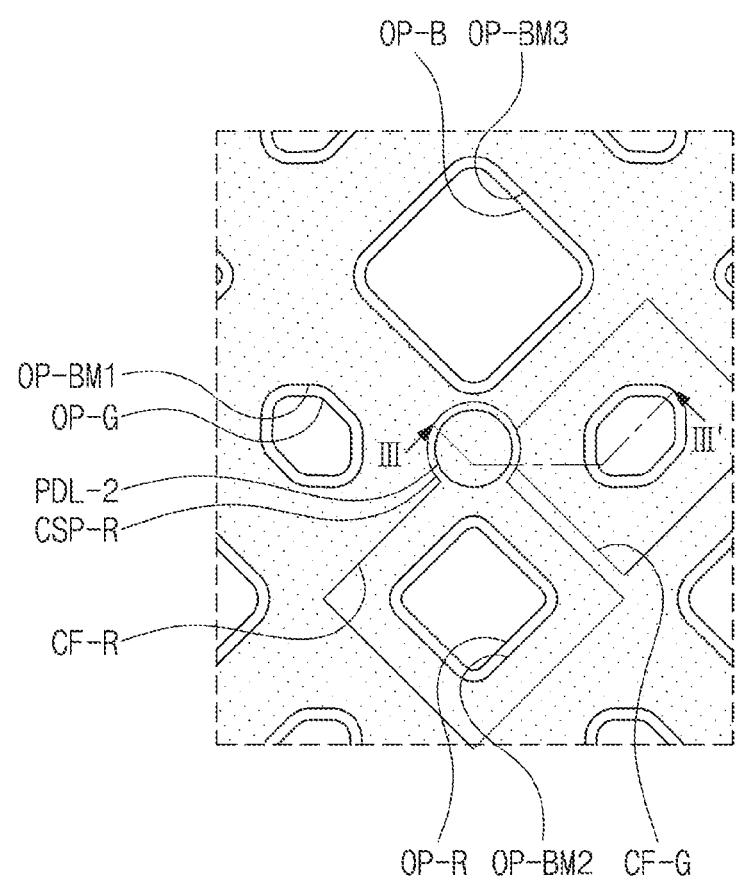
Figure 6D:
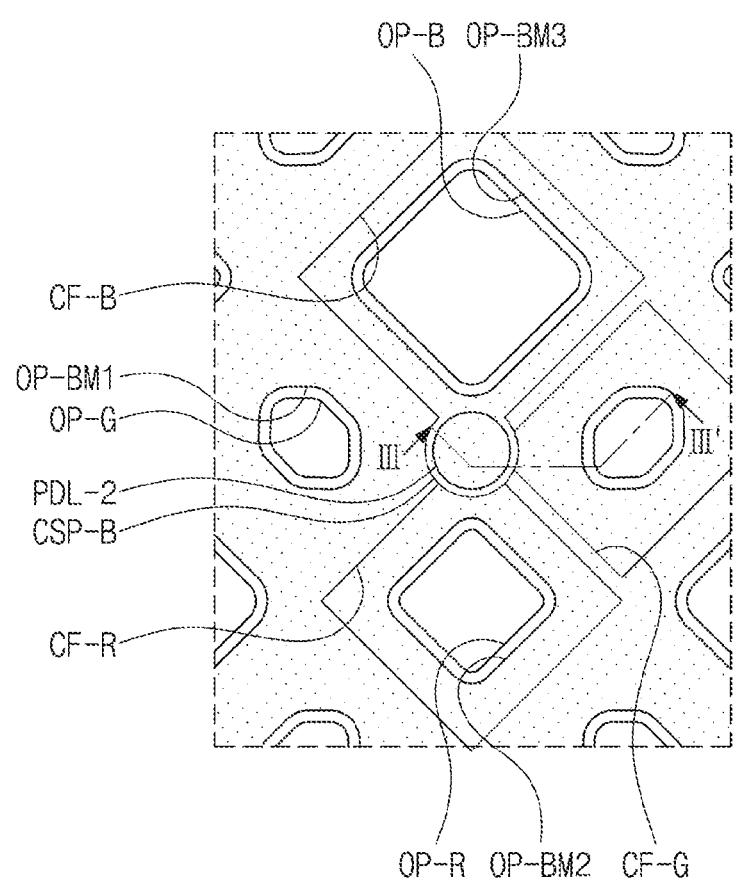
Figure 6E:
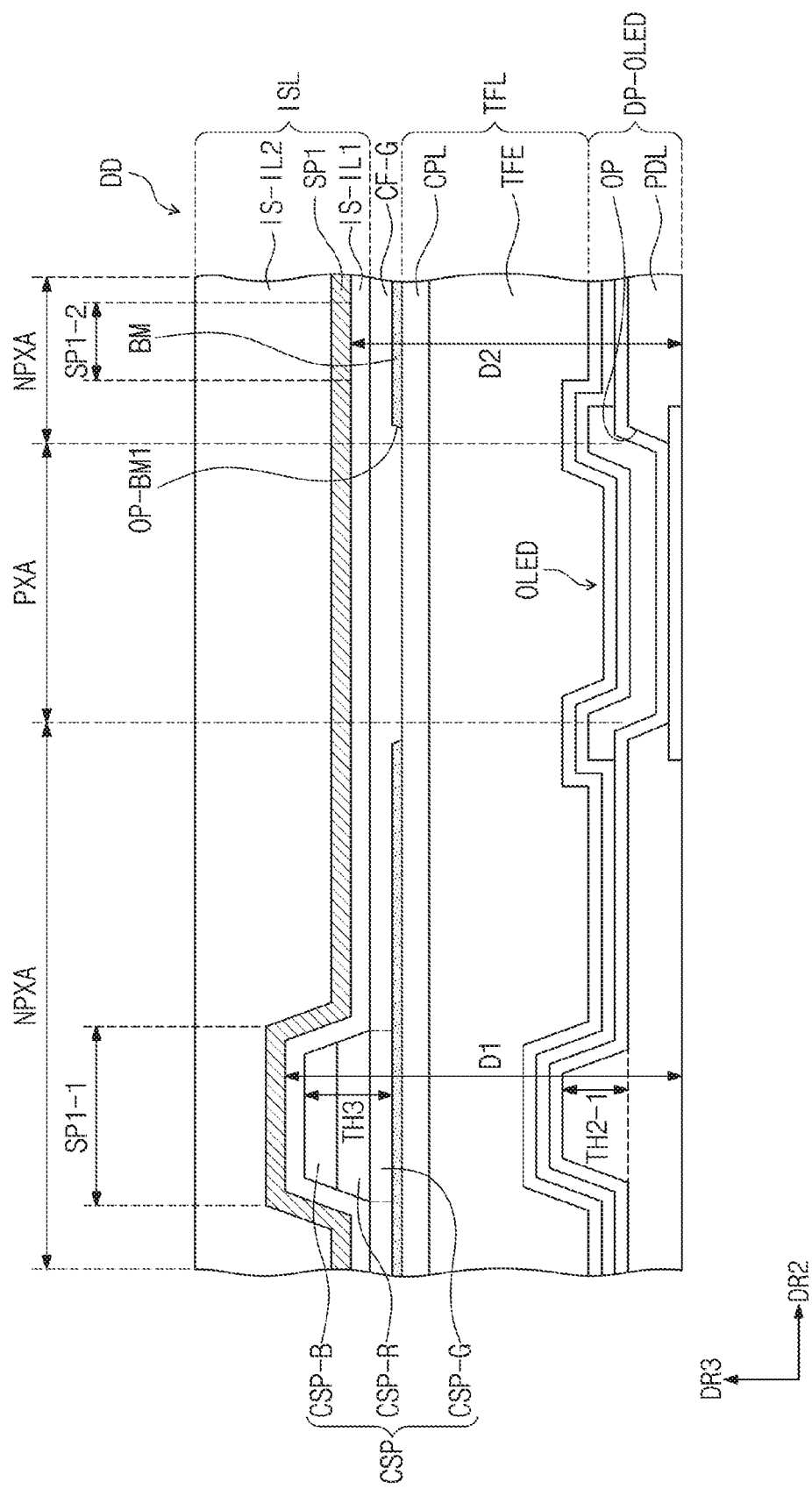
FIGS. 6E and 6F are enlarged cross-sectional views each illustrating a display device according to an exemplary embodiment.
Figure 6F:
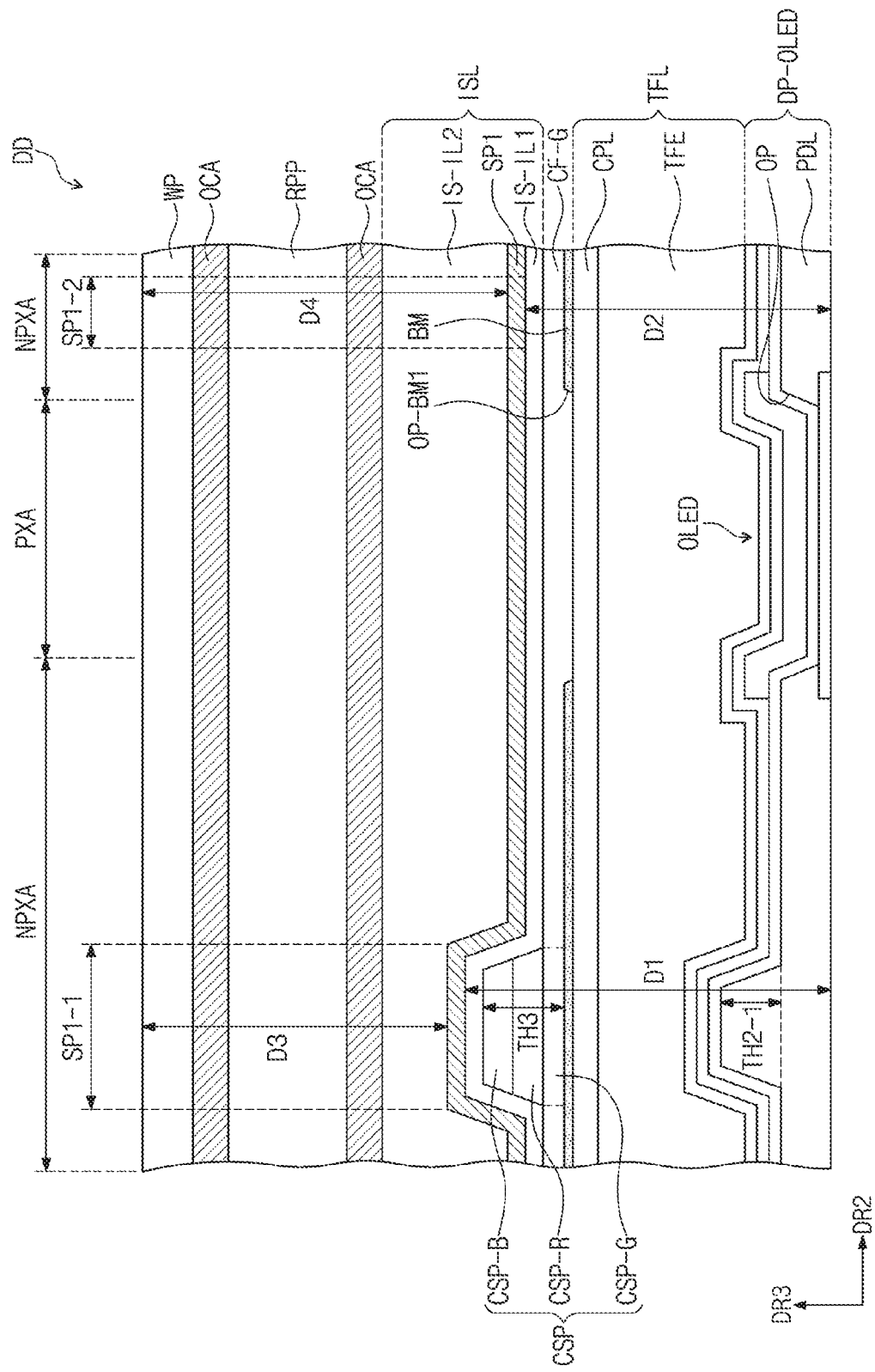

FIG. 6A is an enlarged plan view illustrating the display device DD according to an exemplary embodiment. FIGS. 6B to 6D are enlarged plan views each illustrating a portion of the display device of FIG. 6A. FIGS. 6E and 6F are enlarged cross-sectional views each illustrating the display device DD according to an exemplary embodiment. The following description of the pixel definition layer PDL will be given based on the definition of the first and second portions PDL-1 and PDL-2 described with reference to FIG. 3D.

FIG. 6A illustrates the enlarged shape of the region 'BB' of FIG. 5B. The region 'BB' of FIG. 5B is a region overlapped with the region 'AA' of FIG. 4A. FIG. 6A shows the planar arrangements of the display panel DP (e.g., see FIG. 5A), the anti-reflection layer RPL (e.g., see FIG. 5A), the input-sensing layer ISL (e.g., see FIG. 5A), which are overlapped with each other in a plan view. Since the first sensor portion SP1 of FIG. 5B is fully overlapped with the region 'BB', the first sensor portion SP1 is not shown in FIG. 6A. In FIG. 6A, relative positions between the second portion PDL-2 and the first, second, and third light-emitting openings OP-G, OP-R, and OP-B of the pixel definition layer PDL (e.g., see FIG. 6E), openings OP-BM1, OP-BM2, and OP-BM3 (hereinafter, light blocking openings) of a light blocking layer BM (e.g., FIG. 6E), color filters CF-G, CF-R, and CF-B, and a color spacer CSP are illustrated.

As shown in FIG. 6A, the light blocking layer BM may be provided in the non-light-emitting region NPXA. The light blocking layer BM may be formed of or include a light-blocking material. For example, the light blocking layer BM may include, for example, an organic material having high light absorptivity. The light blocking layer BM may include a black pigment or a black dye. The light blocking layer BM may include a photo-sensitive organic material and, for example, may include a coloring agent, such as pigments or dyes. The light blocking layer BM may have a single- or multi-layered structure.

The light blocking layer BM may be provided to define a first light blocking opening OP-BM1, a second light blocking opening OP-BM2, and a third light blocking opening OP-BM3 corresponding to the first, second, and third light-emitting openings OP-G, OP-R, and OP-B, respectively. The first, second, and third light-emitting openings OP-G, OP-R, and OP-B may be provided in the first, second, and third light blocking openings OP-BM1, OP-BM2, and OP-BM3, respectively, when viewed in a plan view.

The color filters CF-G, CF-R, and CF-B may include a first color filter CF-G, a second color filter CF-R, and a third color filter CF-B, which are provided to correspond to the first, second, and third light-emitting openings OP-G, OP-R, and OP-B, respectively. The first color filter CF-G may be formed of or include an organic material including green dye or green pigment. The second color filter CF-R may be red, and the third color filter CF-B may be blue.

The first, second, and third color filters CF-G, CF-R, and CF-B may not be overlapped with each other but may have edges that are located to be in contact with each other. In FIG. 6A, the first, second, and third color filters CF-G, CF-R, and CF-B are illustrated to be spaced apart from each other, for clear distinction between the first, second, and third color filters CF-G, CF-R, and CF-B.

The first, second, and third color filters CF-G, CF-R, and CF-B may be sequentially formed, as shown in FIGS. 6B to 6D. The formation of each of the first, second, and third color filters CF-G, CF-R, and CF-B may include forming a preliminary color layer therefor and patterning the preliminary color layer using a photolithography process. Because of a potential process error, at least two of the first, second, and third color filters CF-G, CF-R, and CF-B may be partially overlapped with each other. The first, second, and third color filters CF-G, CF-R, and CF-B may be formed by an inkjet printing method, but the inventive concepts are not limited to a specific method for forming the first, second, and third color filters CF-G, CF-R, and CF-B.

The color spacer CSP may be provided in the spacer region surrounded by the first, second, and third light-emitting openings OP-G, OP-R, and OP-B. In the present exemplary embodiment, the color spacer CSP will be described as a distinct element that is different from the first, second, and third color filters CF-G, CF-R, and CF-B.

When viewed in a plan view, the color spacer CSP may be provided to cover the second portion PDL-2. An overlapping area between the color spacer CSP and the second portion PDL-2 may be larger than or equal to 90% of the area of the color spacer CSP. When viewed in a plan view, the second portion PDL-2 may be provided in the color spacer CSP. In an exemplary embodiment, the second portion PDL-2 may be substantially fully overlapped with the color spacer CSP. In the case where the second portion PDL-2 is substantially fully overlapped with the color spacer CSP, the color spacer CSP may be formed to have an area that is larger than a sum of the area of the second portion PDL-2 and a marginal area, which is given in consideration of process tolerance in a process of forming the color spacer CSP on the second portion PDL-2.

As shown in FIG. 6E, the light blocking layer BM may be provided on the uppermost layer of the upper insulating layers TFL. In the present exemplary embodiment, the light blocking layer BM may be provided on the capping layer CPL and may be in contact with the capping layer CPL. In the case where the capping layer CPL is omitted, the light blocking layer BM may be provided on the uppermost layer of the thin encapsulation layer TFE.

The first, second, and third color filters CF-G, CF-R, and CF-B and the color spacer CSP may be provided on the light blocking layer BM. A portion of the light blocking layer BM may be provided between the capping layer CPL and a first layer CSP-G of the color spacer CSP. The light blocking layer BM may be provided near the display device layer DP-OLED, and in this case, reflection light may have a narrow color distribution property. As a result, it may be possible to improve a color property of the reflection light. However, the cross-sectional position of the light blocking layer BM is not limited to the above example. In an exemplary embodiment, the light blocking layer BM may be omitted.

In the present exemplary embodiment, the color spacer CSP may have a layer structure including at least two layers. For example, as shown in FIG. 6E, the color spacer CSP may be provided to have a triple-layered structure.

The first layer CSP-G may be formed of or include the same material as one of the first, second, and third color filters CF-G, CF-R, and CF-B, a second layer CSP-R may be formed of or include the same material as another one of the first, second, and third color filters CF-G, CF-R, and CF-B, and a third layer CSP-B may be formed of or include the same material as the other one of the first, second, and third color filters CF-G, CF-R, and CF-B. In the present exemplary embodiment, the color filters, which are respectively associated with the first, second, and third layers CSP-G, CSP-R, and CSP-B, will be referred to as the first color filter CF-G, the second color filter CF-R, and the third color filter CF-B in the order enumerated.

As shown in FIGS. 6B to 6D, the first layer CSP-G and the first color filter CF-G may be formed by the same process and may have a single body shape. The second layer CSP-R and the second color filter CF-R may be formed by the same process and may have a single body shape. The third layer CSP-B and the third color filter CF-B may be formed by the same process and may have a single body shape. A stacking structure of the color spacer CSP may be determined by a forming order of the first, second, and third color filters CF-G, CF-R, and CF-B, which may be variously changed.

Even when each corresponding pair of the color filters CF-G, CF-R, and CF-B and the layers CSP-G, CSP-R, and CSP-B are formed by the same process, the first layer CSP-G may be separated from the first color filter CF-G, the second layer CSP-R may be separated from the second color filter CF-R, and the third layer CSP-B may be separated from the third color filter CF-B. This example is not illustrated in the drawings. Each corresponding pair of the color filters CF-G, CF-R, and CF-B and the layers CSP-G, CSP-R, and CSP-B may have substantially the same thickness. For example, the first layer CSP-G may have the same thickness as the first color filter CF-G.

In the present exemplary embodiment, the color spacer CSP is illustrated to have a triple-layered structure, but if, in one of the processes of FIGS. 6B to 6D, only the color filter is formed, the color spacer CSP may be formed to have a double-layered structure. The color spacer CSP may have a thickness that is larger than a thickness of each of the first, second, and third color filters CF-G, CF-R, and CF-B. This is because the color spacer CSP has a multi-layered structure including at least two layers. The first, second, and third color filters CF-G, CF-R, and CF-B may have the same thickness or at least two different thicknesses.

As shown in FIG. 6E, the color spacer CSP may compensate a non-uniform distance between the second electrode CE and the sensing electrode (illustrated as the first sensor portion SP1 in FIG. 7C), which is caused by the presence of the second portion PDL-2. If the color spacer CSP is not formed, a distance between a region (hereinafter, a first region) of the second electrode CE, which is overlapped with the second portion PDL-2, and the first sensor portion SP1 may be smaller than a distance between another region (hereinafter, a second region) of the second electrode CE, which is not overlapped with the second portion PDL-2, and the first sensor portion SP1. The variation in distance between the second electrode CE and the first sensor portion SP1 may cause a noise in the input-sensing layer ISL.

In the present exemplary embodiment, a distance D1 between a first region SP1-1 of the first sensor portion SP1, which is overlapped with the color spacer CSP and the base insulating layer (i.e., the intermediate organic layer 30) may be larger than a distance D2 between a second region SP1-2 of the first sensor portion SP1, which is not overlapped with the color spacer CSP, and the intermediate organic layer 30. A distance between the first region SP1-1 of the first sensor portion SP1 and the second electrode CE may be substantially equal to a distance between the second region SP1-2 of the first sensor portion SP1 and the second electrode CE.

Here, a thickness TH3 of the color spacer CSP may be larger than a thickness TH2-1 of the second portion PDL-2. A value, which is obtained by subtracting a thickness of the first layer CSP-G from the thickness TH3 of the color spacer CSP (e.g., a sum of thicknesses of the second and third layers CSP-R and CSP-B, in the present exemplary embodiment) may be substantially equal to the thickness TH2-1 of the second portion PDL-2. This is because, as shown in FIG. 6E, the first color filter CF-G is disposed on the second region SP1-2 of the first sensor portion SP1, when the first layer CSP-G is disposed on the first region SP1-1 of the first sensor portion SP1. Here, the thicknesses TH3 and TH2-1 may be vertical lengths of the color spacer CSP and the second portion PDL-2, which are respectively measured in the third direction DR3.

As described above, the first sensor portion SP1 may have a non-flat structure and may include the first and second regions SP1-1 and SP1-2 that are located at different levels. The first sensor portion SP1 may have a step structure. The non-flat structure of the first sensor portion SP1 may result from the presence of the color spacer CSP. As shown in FIG. 6F, a distance D3 between the first region SP1-1 of the first sensor portion SP1 and the top surface of the window panel WP may be smaller than a distance D4 between the second region SP1-2 of the first sensor portion SP1, which is not overlapped with the color spacer CSP, and the top surface of the window panel WP. This is because portions of the window panel WP covering the first and second regions SP1-1 and SP1-2 have flat top surfaces.

In the display device DD described with reference to FIGS. 6A to 6F, the color spacer CSP is described as an element that is different from the color filters CF-G, CF-R, and CF-B. In an aspect of the inventive concepts, the layers of the color spacer CSP may be defined as a portion of the color filters CF-G, CF-R, and CF-B.

For example, in FIG. 6B, the first color filter CF-G and the first layer CSP-G may be defined as different portions of the green color filter. For example, the first color filter CF-G may be defined as a first portion, and the first layer CSP-G may be defined as a second portion. In FIG. 6C, the second color filter CF-R and the second layer CSP-R may be defined as different portions (e.g., first and second portions, respectively) of the red color filter. In FIG. 6D, the third color filter CF-B and the third layer CSP-B may be defined as different portions (e.g., first and second portions, respectively) of the blue color filter.

Figure 7A:
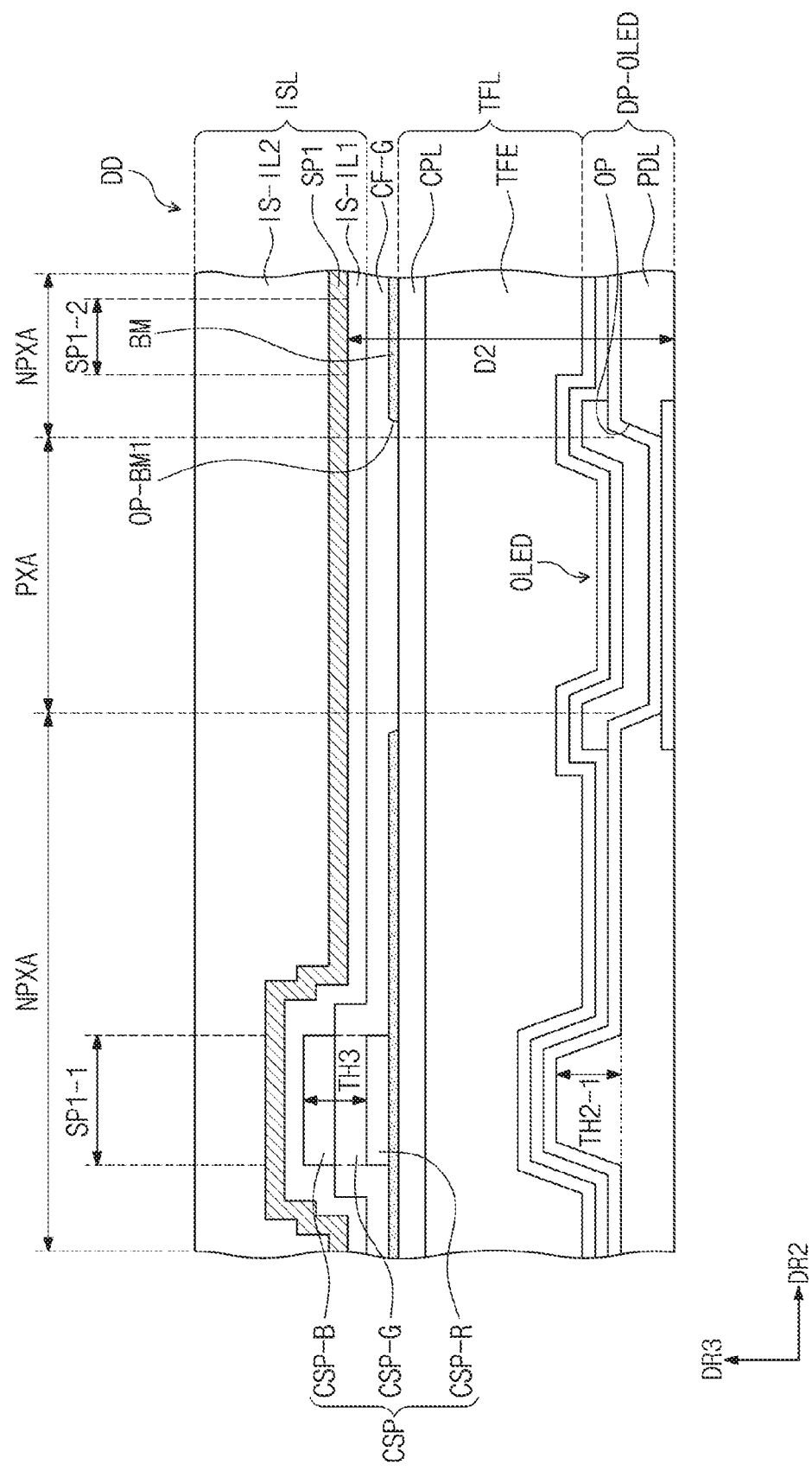
FIGS. 7A, 7B, and 7C are enlarged cross-sectional views each illustrating a display device according to an exemplary embodiment.
Figure 7B:
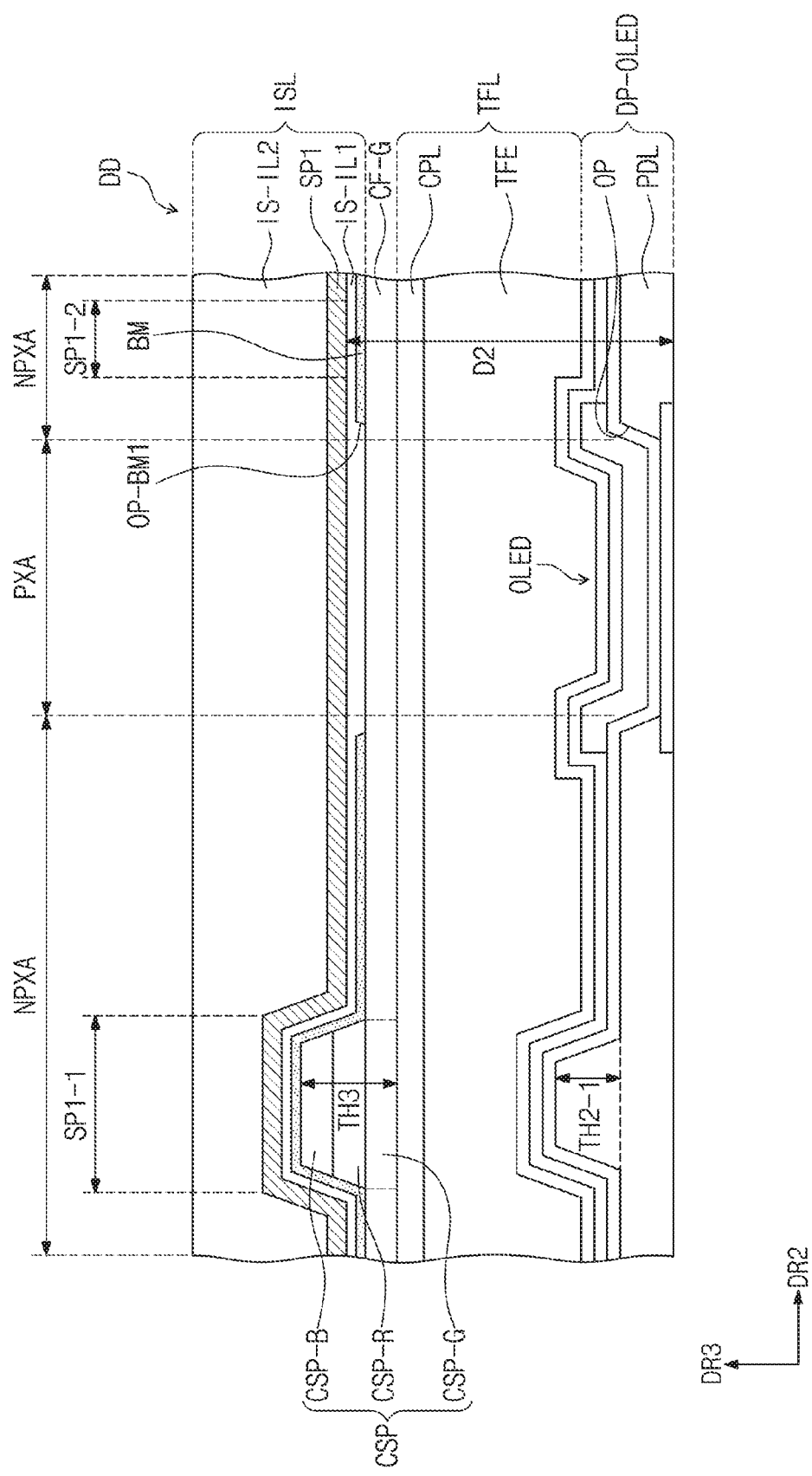
Figure 7C:
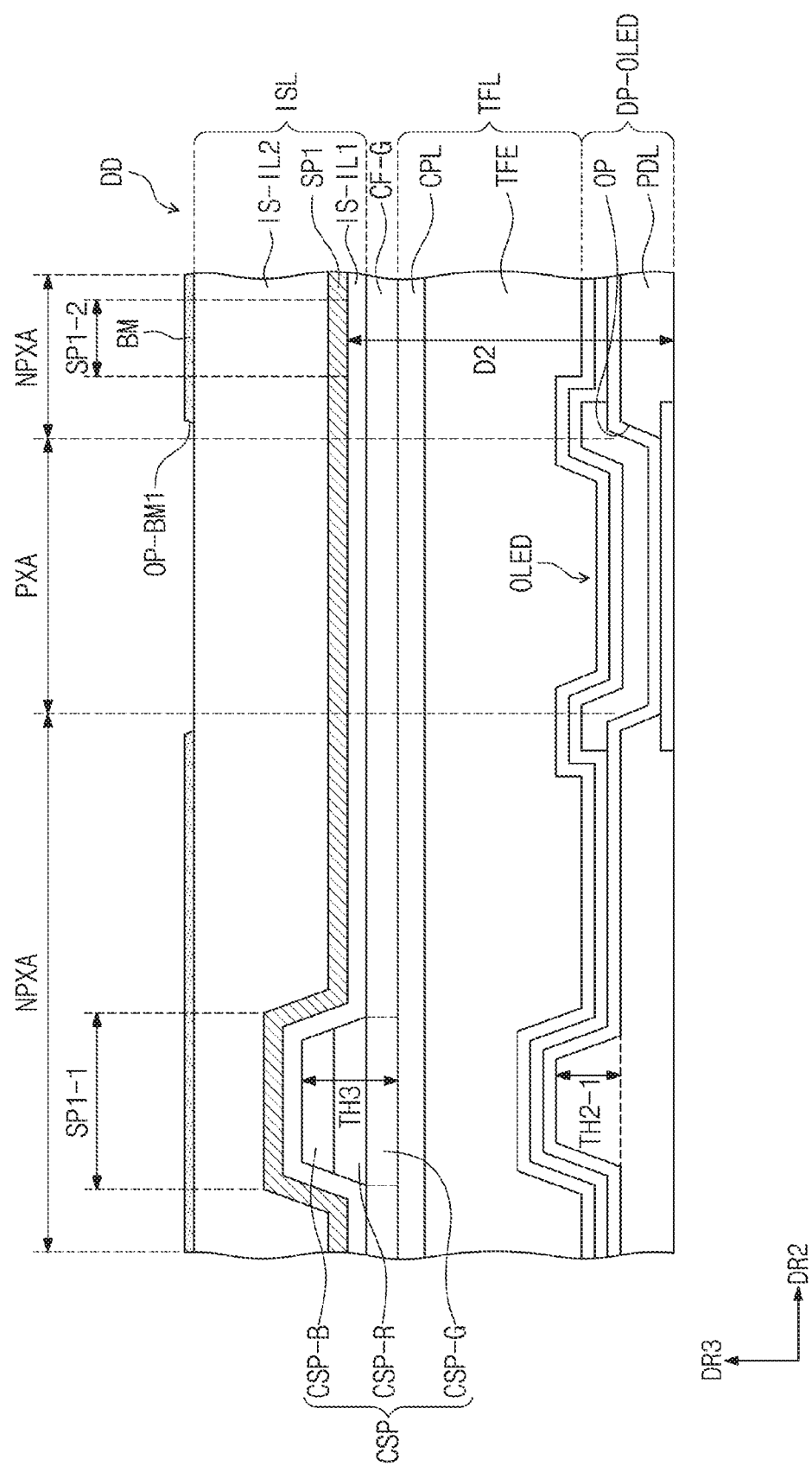

FIGS. 7A to 7C are enlarged cross-sectional views each illustrating the display device DD according to an exemplary embodiment. The cross-sectional views of FIGS. 7A to 7C correspond to that of FIG. 6E. However, in order to reduce complexity of the drawings, the layers provided below the display device layer DP-OLED are not shown in FIGS. 7A to 7C. Hereinafter, for concise description, an element previously described with reference to FIGS. 6A to 6F will be identified by the same reference number without repeating an overlapping description thereof.

As shown in FIG. 7A, the stacking structure of the color spacer CSP may be changed. First, a first layer CSP-R may be formed when the second color filter CF-R is formed as shown in FIG. 6C. After forming the first layer CSP-R, a second layer CSP-G may be formed when the first color filter CF-G is formed as shown in FIG. 6B. Finally, a third layer CSP-B may be formed when the third color filter CF-B is formed as shown in FIG. 6D.

As shown in FIGS. 7B and 7C, the position of the light blocking layer BM may be changed. As shown in FIG. 7B, the light blocking layer BM may be provided on the color spacer CSP. After the formation of the first to third color filters CF-G, CF-R, and CF-B, the light blocking layer BM may be formed. As shown in FIG. 7C, the light blocking layer BM may also be formed on the second insulating layer IS-IL2.

Figure 8A:
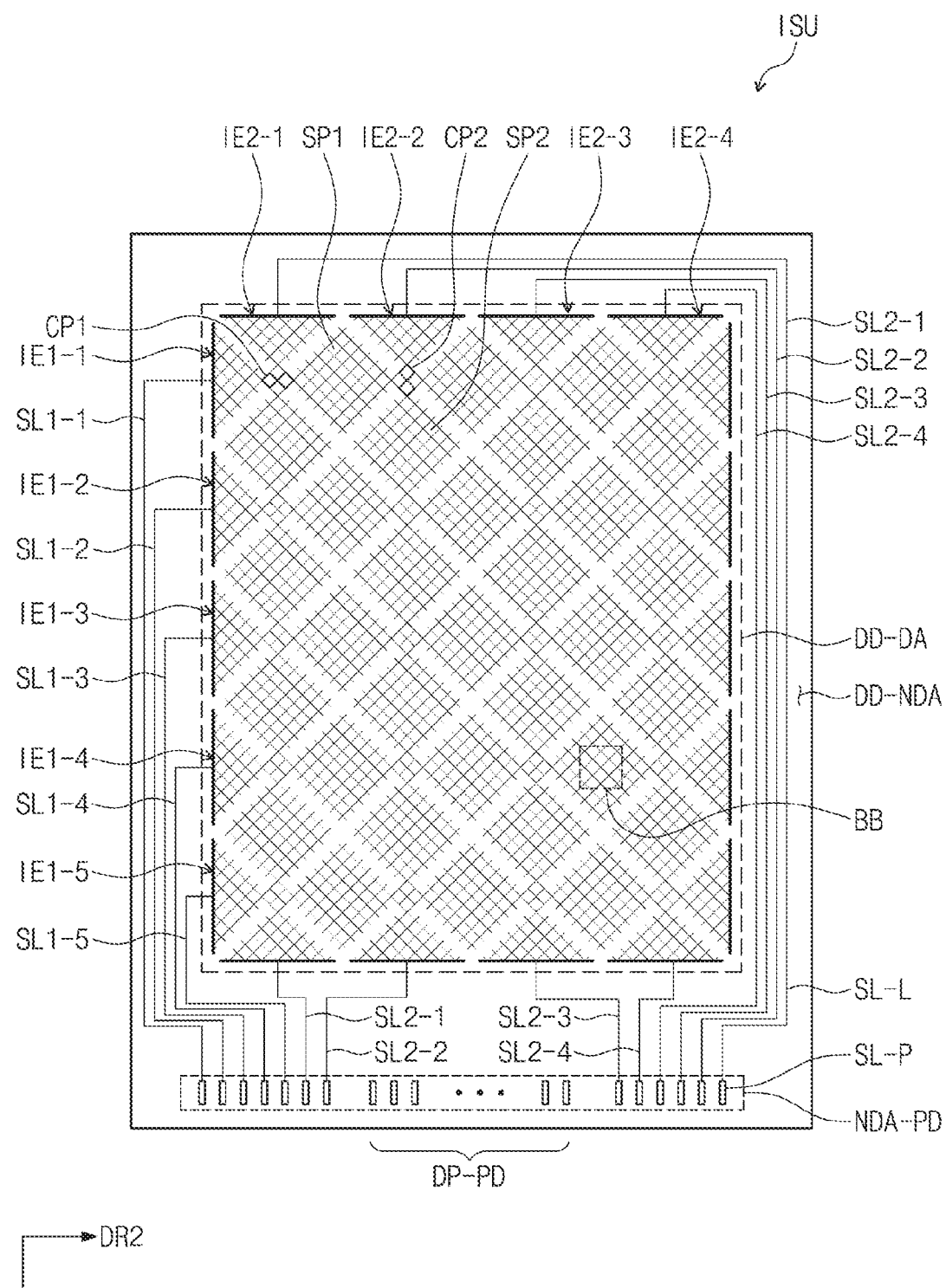
FIG. 8A is a plan view illustrating an input-sensing layer according to an exemplary embodiment.
Figure 8B:
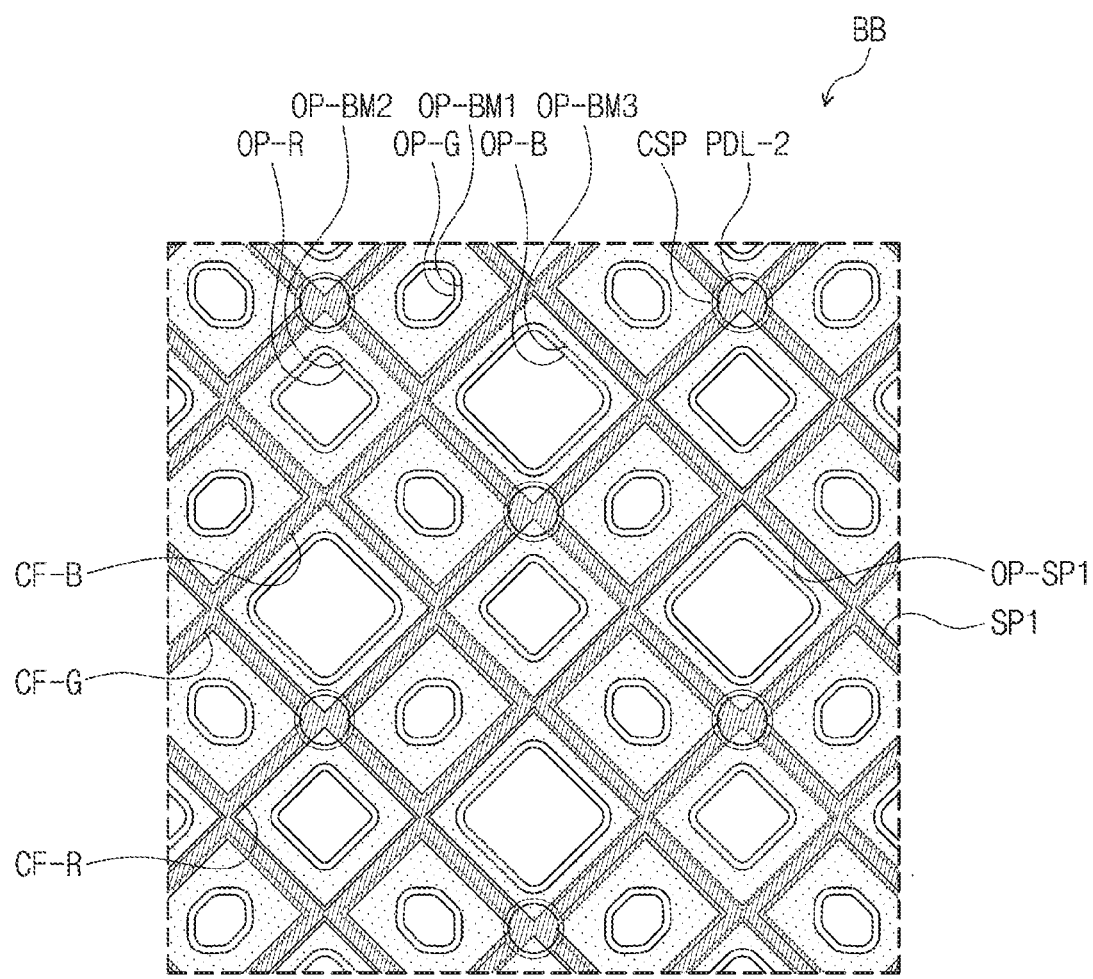
FIG. 8B is an enlarged plan view illustrating a portion of an input-sensing layer according to an exemplary embodiment.

FIG. 8A is a plan view illustrating the input-sensing layer ISL according to an exemplary embodiment. FIG. 8B is an enlarged plan view of the region 'BB' of FIG. 8A. For concise description, an element previously described with reference to FIGS. 1 to 7C will be identified by the same reference number without repeating an overlapping description thereof.

As shown in FIG. 8A, the first sensing electrodes 1E1-1 to 1E1-5 and the second sensing electrodes 1E2-1 to 1E2-4 may be provided to have a mesh shape. Thus, it may be possible to reduce parasitic capacitance between the second electrode CE (e.g., see FIG. 6E) and the first and second sensing electrodes IE1-1 to 1E1-5 and 1E2-1 to 1E2-4. In addition, as will be described below, the first sensing electrodes 1E1-1 to 1E1-5 and the second sensing electrodes 1E2-1 to 1E2-4 may not be overlapped with the light-emitting regions PXA-R, PXA-G, and PXA-B, and thus may be hardly recognized by a user of the display device DD.

The first sensing electrodes IE1-1 to 1E1-5 and the second sensing electrodes 1E2-1 to 1E2-4 may be formed of or include at least one of materials (e.g., silver, aluminum, copper, chromium, nickel, and titanium), which can be formed by a low temperature process, but the inventive concepts are not limited thereto. Even when the input-sensing layer ISL is formed by a successive process, it may be possible to prevent the organic light emitting diodes OLED (e.g., see FIG. 6E) from being damaged.

In the present exemplary embodiment, similar to the input-sensing layer ISL described with reference to FIGS. 5A to 5F, the first connecting portions CP1 may be formed from the first conductive layer IS-CL1, and the first sensor portions SP1, the second sensor portions SP2, and the second connecting portions CP2 may be formed from the second conductive layer IS-CL2. In an exemplary embodiment, the input-sensing layer ISL may further include first and second dummy sensor portions, which are formed from the first conductive layer IS-CL1. The first dummy sensor portions are overlapped with the first sensor portions SP1. The second dummy sensor portions are overlapped with the second sensor portions SP2. Each of the first dummy sensor portions may be connected to a corresponding one of the first sensor portions SP1. Each of the second dummy sensor portions may be connected to a corresponding one of the second sensor portions SP2.

As shown in FIG. 8B, the first sensor portion SP1 may be overlapped with the non-light-emitting region NPXA. The first sensor portion SP1 may include mesh lines, which are arranged to define openings OP-SP1 (hereinafter, electrode openings). The electrode openings OP-SP1 may include three opening groups, which corresponds to the first, second, and third light-emitting openings OP-G, OP-R, and OP-B, respectively. Each of the mesh lines may have a triple layered structure (e.g., including a titanium layer, an aluminum layer, and a titanium layer). In the above examples, the electrode openings OP-SP1 are illustrated to correspond to the first, second, and third light-emitting openings OP-G, OP-R, and OP-B in the one-to-one manner, but the inventive concepts are not limited thereto. Each of the electrode openings OP-SP1 may correspond to two or more openings of the openings OP-G, OP-R, and OP-B.

In FIGS. 6A to 6F and FIGS. 8A and 8B, each of the input-sensing layers ISL is illustrated to be a double-layered touch sensor, which includes two conductive layers and is operated in the capacitance-sensing manner, but the inventive concepts are not limited thereto. In an exemplary embodiment, the input-sensing layer ISL may be a single-layered touch sensor, which includes a single conductive layer and is operated in the capacitance-sensing manner.

The single-layered touch sensor may include a plurality of sensing electrodes IE and a plurality of signal lines SL. The sensing electrodes IE may have specific coordinate information. For example, the sensing electrodes IE may be arranged in a matrix shape and may be connected to the signal lines SL, respectively. The sensing electrodes IE may be provided to have a mesh shape and may be operated in a self-capacitance manner.

FIGS. 9A, 9B, 9C, 10A, 10B, and 11 are perspective views each illustrating the display device DD according to an exemplary embodiment. Each of the display devices DD described with reference to FIGS. 1 to 8B may be used to realize one of flexible display devices to be described below.

Figure 9A:
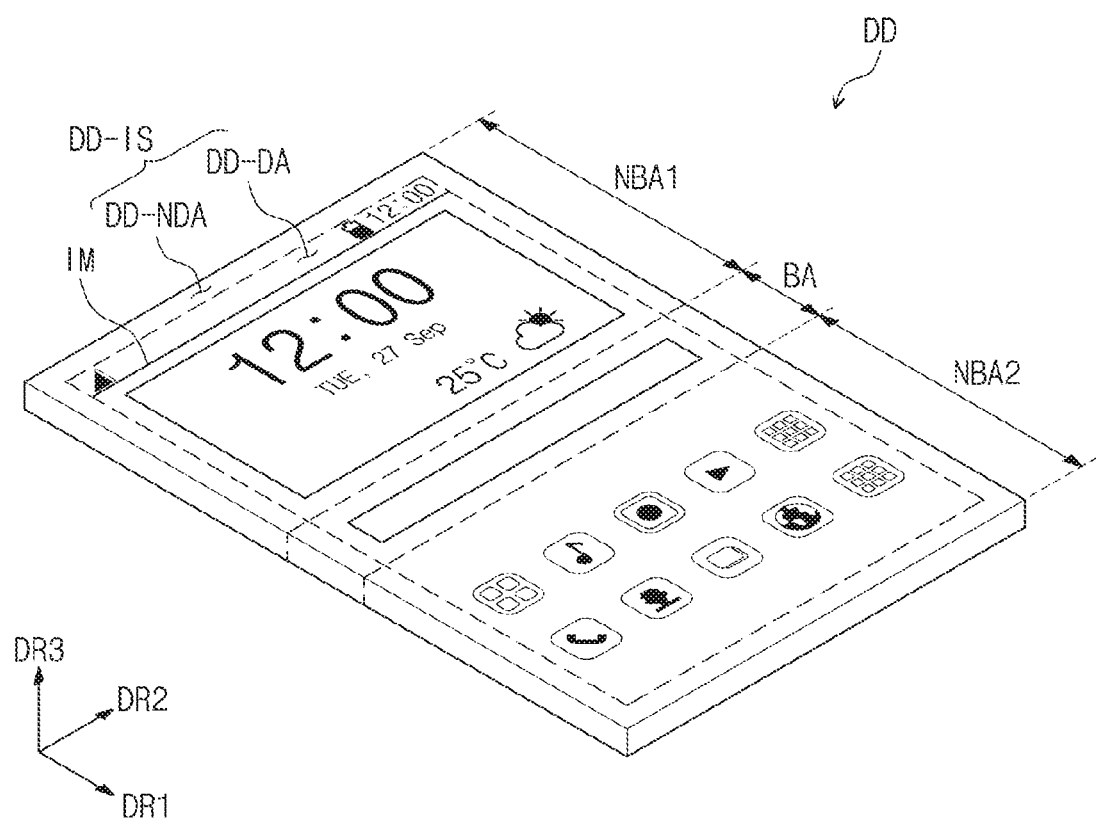
FIGS. 9A, 9B, and 9C are perspective views each illustrating a display device according to an exemplary embodiment.
Figure 9B:
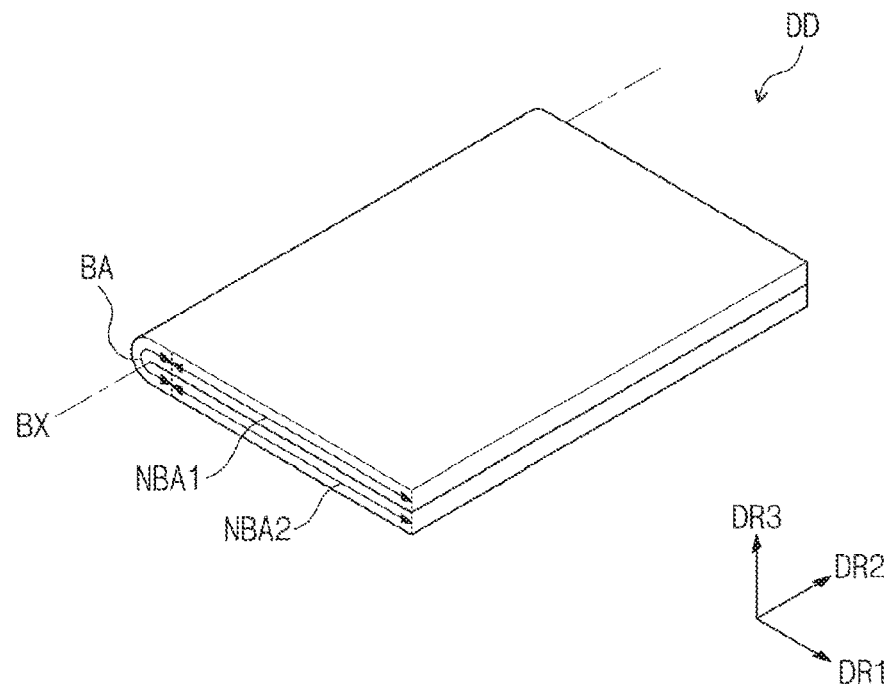
Figure 9C:
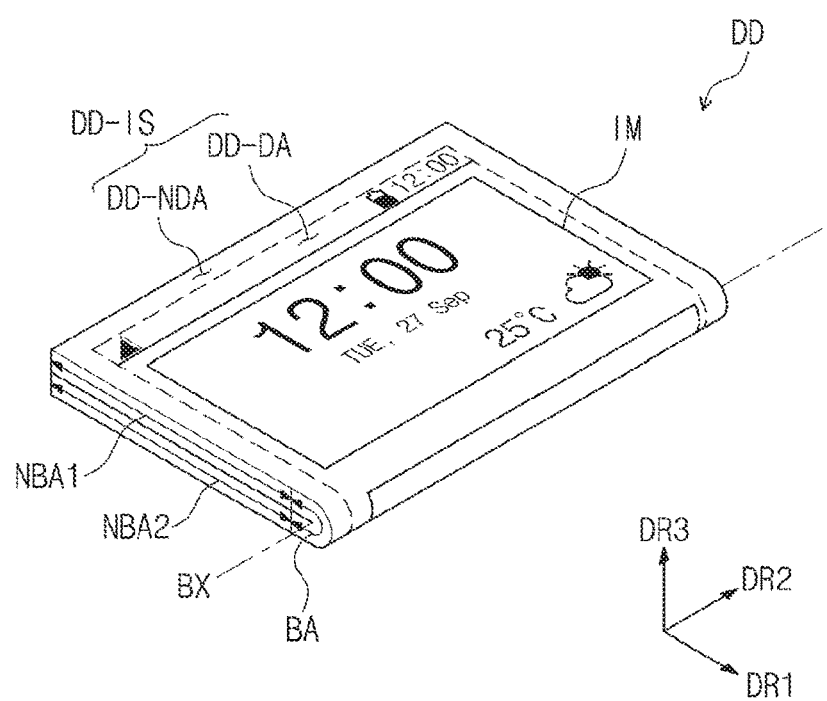

As shown in FIGS. 9A to 9C, the display device DD may include a plurality of regions, which are defined based on its operation mode. The display device DD may include a first region NBA1, a second region NBA2, and a third region BA between the first and second regions NBA1 and NBA2. The third region BA may be configured to be bent about a bending axis BX and to have a variable curvature. Hereinafter, the first region NBA1, the second region NBA2, and the third region BA will be referred to as a first non-bending region NBA1, a second non-bending region NBA2, and a bending region BA, respectively.

As shown in FIG. 9B, the display device DD may be configured to perform an inner-bending operation, allowing the display surface DD-IS of the first non-bending region NBA1 to face the display surface DD-IS of the second non-bending region NBA2. As shown in FIG. 9C, the display module DM may be configured to perform an outer-bending operation, allowing the display surface DD-IS to be exposed to the outside.

In an exemplary embodiment, the display device DD may include a plurality of the bending regions BA. In addition, the bending region BA may be defined, based on a shape of the display device DD manipulated by a user. For example, unlike that shown in FIGS. 9B and 9C, the bending region BA may be defined to be parallel to the first direction axis DR1 or in a diagonal direction. An area of the bending region BA may not be fixed and may vary depending on its curvature radius. In an exemplary embodiment, the display device DD may be configured to repeat only an operation mode illustrated in FIGS. 9A and 9B or to repeat only an operation mode illustrated in FIGS. 9A and 9C.

As shown in FIGS. 9A and 9B, the display device DD may include the first non-bending region NBA1, the second non-bending region NBA2, and the bending region BA. The first non-bending region NBA1, the second non-bending region NBA2, and the bending region BA may be defined based on the display panel DP (e.g., see FIGS. 2A and 2B). The input-sensing unit, the anti-reflection unit, and the window unit may be provided in only the first non-bending region NBA1.

Figure 10A:
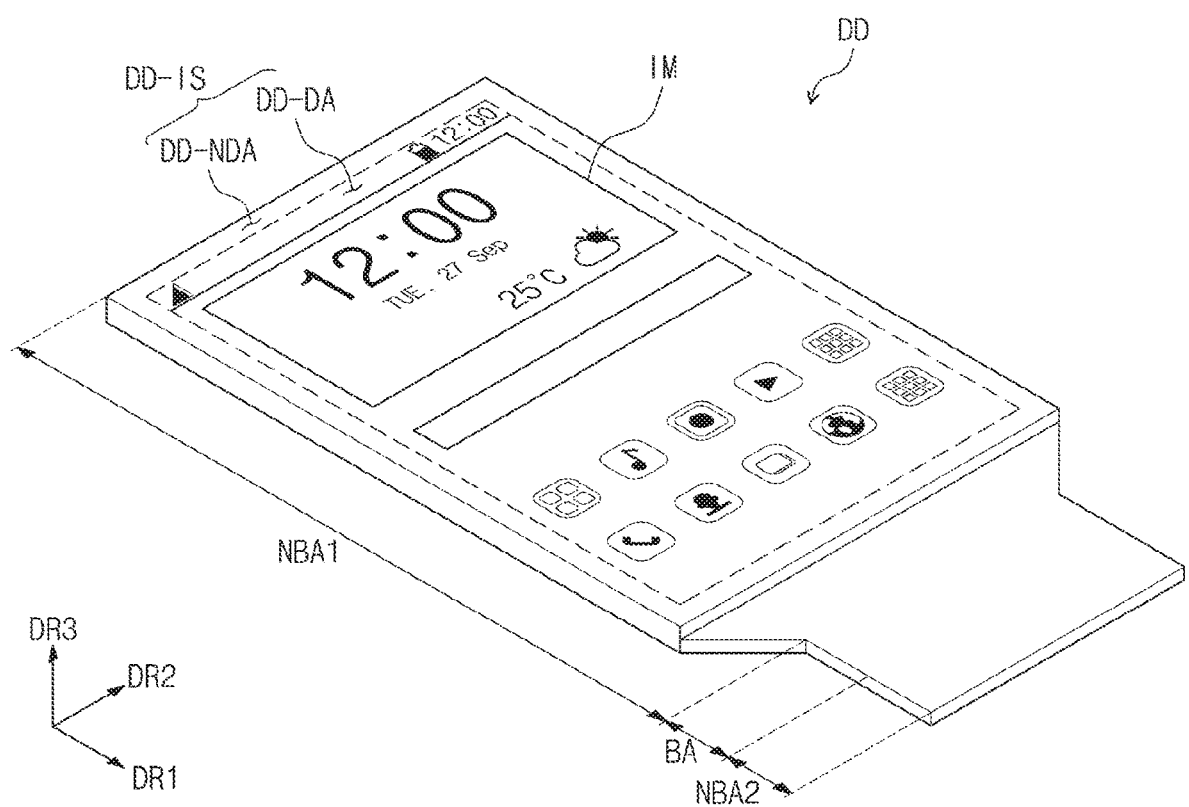
FIGS. 10A and 10B are perspective views each illustrating a display device according to an exemplary embodiment.
Figure 10B:
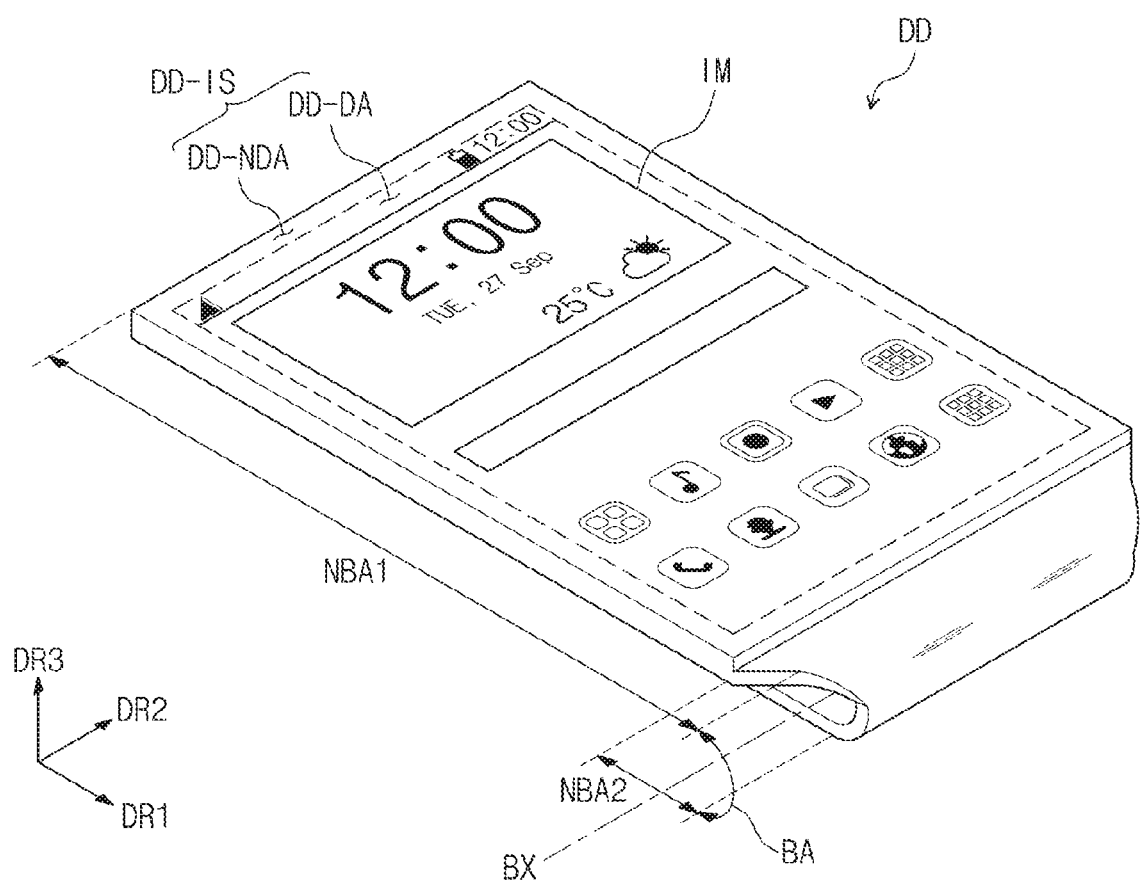

As shown in FIG. 10A, a width, in the second direction DR2, of the display panel DP may vary from region to region. For example, the bending region BA and the second non-bending region NBA2 may have widths less than the width of the first non-bending region NBA1. Since the bending region BA has a relatively small width, the bending region BA may be easily bent. Meanwhile, as shown in FIG. 10A, the first non-bending region NBA1 may include a border region having a gradually decreasing width. In an exemplary embodiment, the border region having a gradually decreasing width may be omitted. As shown in FIG. 10B, when the display device DD is in a bent state, the second non-bending region NBA2 may face the first non-bending region NBA1 and may be spaced apart from the first non-bending region NBA1.

Figure 11:
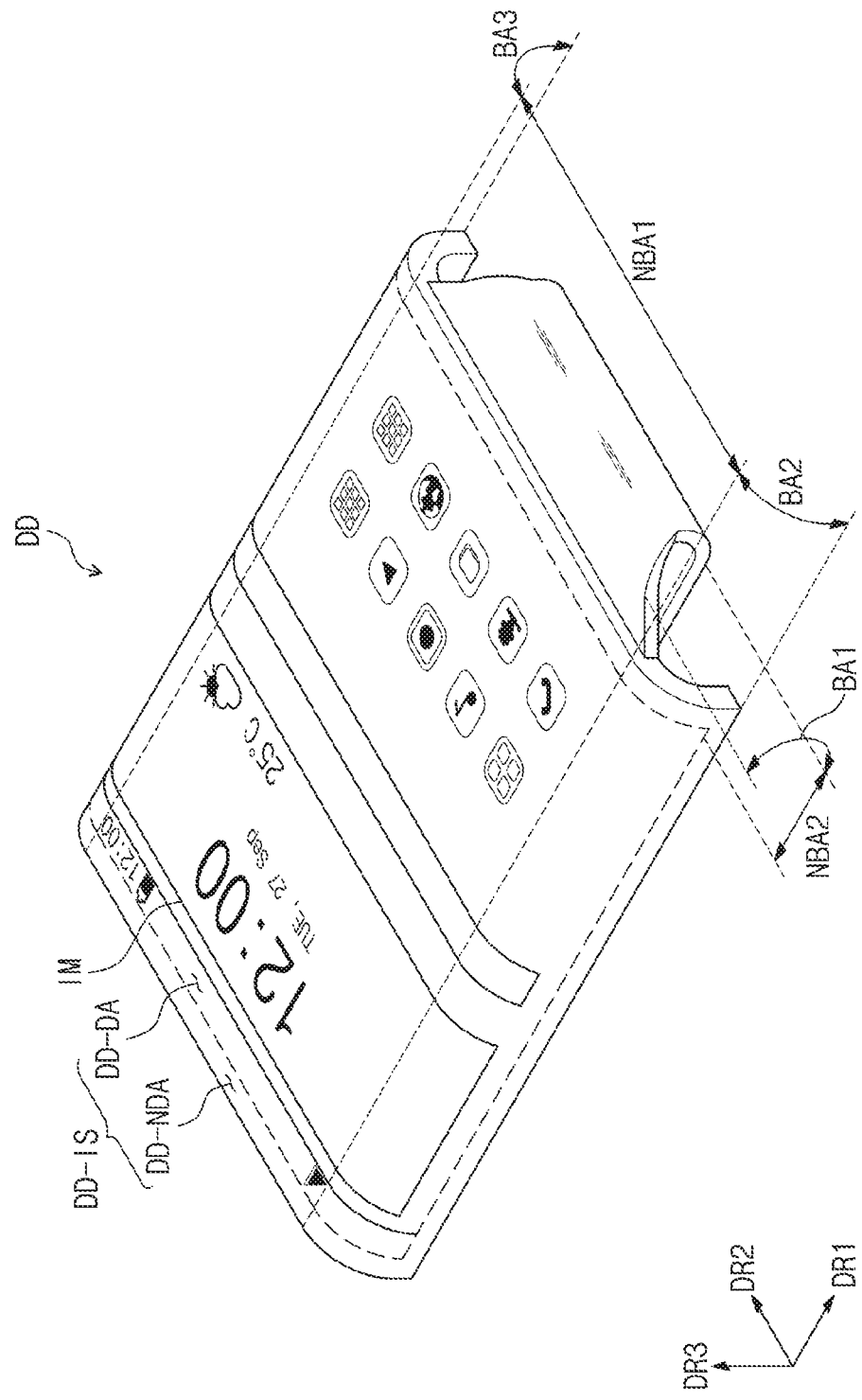
FIG. 11 is a perspective view illustrating a display device according to an exemplary embodiment.

As shown in FIG. 11, the display device DD may include three bending regions BA1, BA2, and BA3. In comparison with the display device DD of FIG. 10B, the second and third bending regions BA2 and BA3 may be defined by bending two opposite edge regions of the first non-bending region NBA1 facing each other in the second direction DR2. The first bending region BA1 may correspond to the bending region BA of FIGS. 10A and 10B. The input-sensing unit, the anti-reflection unit, and the window unit of FIGS. 2A to 2B may be overlapped with the first non-bending region NBA1 and the second and third bending regions BA2 and BA3.

Because of a shape of a pixel definition layer, a space between a second electrode and a sensing electrode may have a non-uniform thickness. According to an exemplary embodiment, a color filter and/or a color spacer may be provided to reduce a variation in thickness of the space that is formed between the second and sensing electrodes, and this may make it possible to prevent or suppress the input-sensing unit from being affected by noise signals resulting from the display panel.

The display device may further include a light blocking layer. In this case, it may be possible to reduce reflectance of external light. Furthermore, it may be possible to allow reflection light to have a narrow color distribution and the consequent improved color property.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display panel comprising a first light-emitting region, a second light-emitting region, a third light-emitting region, and a non-light-emitting region, wherein the non-light-emitting region is adjacent to the first to third light-emitting regions;
an anti-reflection unit directly disposed on the display panel; and
an input-sensing unit directly disposed on the anti-reflection unit, the input-sensing unit comprising a sensing electrode,
wherein the display panel further comprises:
a first light emitting element, a second light emitting element, and a third light emitting element overlapping the first to third light-emitting regions, respectively, each of the first to third light emitting elements comprising a first electrode, which is in contact with a base insulating layer, a second electrode, and a light emitting layer, which is disposed between the first electrode and the second electrode;
a pixel definition layer, which is in contact with the base insulating layer and is disposed below the second electrode, the pixel definition layer comprising a first portion, in which a light-emitting opening exposing the first electrode is defined, and a second portion, which is disposed on, and overlaps the first portion; and
a plurality of thin films disposed on the second electrode, wherein the anti-reflection unit comprises:
a first color filter, a second color filter, and a third color filter overlapping the first to third light emitting elements, respectively; and
a color spacer, which overlaps the second portion and is thicker than each of the first to third color filters,
wherein a distance between a first portion of the sensing electrode and the base insulating layer is larger than a distance between a second portion of the sensing electrode and the base insulating layer, wherein the first portion of the sensing electrode overlaps the color spacer, the second portion of the sensing electrode does not overlap the color spacer.

2. The display device of claim 1, wherein a distance between the first portion of the sensing electrode and the second electrode is substantially equal to a distance between the second portion of the sensing electrode and the second electrode.

3. The display device of claim 1, wherein a thickness of the color spacer is larger than a thickness of the second portion of the pixel definition layer.

4. The display device of claim 1, wherein the color spacer comprises at least a first layer and a second layer disposed on the first layer,
the first layer comprises a same material as one of the first to third color filters, and
the second layer comprises a same material as another one of the first to third color filters.

5. The display device of claim 4, wherein the first layer has substantially a same thickness as the one of the first to third color filters, and
the second layer has substantially a same thickness as the another one of the first to third color filters.

6. The display device of claim 4, wherein the first layer and the one of the first to third color filters have a single body shape, and
the second layer and the another one of the first to third color filters have a single body shape.

7. The display device of claim 4, wherein the color spacer further comprises a third layer, wherein the third layer comprises a same material as a remaining one of the first to third color filters, the third layer has substantially a same thickness as the remaining one of the first to third color filters, and is disposed on the first layer and the second layer.

8. The display device of claim 7, wherein a sum of the thickness of the second layer and the thickness of the third layer is substantially equal to a thickness of the second portion of the pixel definition layer.

9. The display device of claim 4, wherein the anti-reflection unit further comprises a light blocking layer, which overlaps the non-light-emitting region, and a light blocking opening corresponding to the light-emitting opening is defined in the light blocking layer.

10. The display device of claim 9, wherein the light blocking layer is disposed between a topmost one of the plurality of thin films and the first layer.

11. The display device of claim 9, wherein the light-emitting opening is positioned in the light blocking opening.

12. The display device of claim 1, wherein an overlapping area between the second portion of the pixel definition layer and the color spacer is larger than or equal to 90% of an area of the color spacer.

13. The display device of claim 1, wherein the second portion of the pixel definition layer has a length of a side or a diameter ranging from about 10 µm to about 25 µm.

14. The display device of claim 1, wherein the first portion of the pixel definition layer and the second portion of the pixel definition layer have a single body shape.

15. The display device of claim 1, wherein the sensing electrode is disposed to have a mesh structure, and an electrode opening corresponding to the light-emitting opening is defined in the sensing electrode.

16. A display device, comprising:
a display panel comprising a first light-emitting region, a second light-emitting region, a third light-emitting region and a non-light-emitting region, wherein the non-light-emitting region is adjacent to the first to third light-emitting regions;
a first color filter, a second color filter, and a third color filter directly disposed on the display panel and overlapping the first to third light-emitting regions, respectively; and
an input-sensing unit directly disposed on the first to third color filters, the input-sensing unit comprising a sensing electrode,
wherein the display panel comprises:
a first light emitting element, a second light emitting element, and a third light emitting element overlapping the first to third light-emitting regions, respectively, each of the first to third light emitting elements comprising a first electrode, which is in contact with a base insulating layer, a second electrode, and a light emitting layer, which is disposed between the first electrode and the second electrode;
a pixel definition layer, which is in contact with the base insulating layer and is disposed below the second electrode, the pixel definition layer comprising a first portion, in which a light-emitting opening exposing the first electrode is defined, and a second portion, which is located adjacent to the first portion and has a thickness larger than the first portion; and
a plurality of thin films disposed on the second electrode,
a portion of the first color filter overlaps the second portion of the pixel definition layer, and
a portion of the second color filter overlaps the second portion of the pixel definition layer and is disposed on the portion of the first color filter.

17. The display device of claim 16, wherein a portion of the third color filter overlaps the second portion of the pixel definition layer and is disposed on the portion of the second color filter.

18. The display device of claim 17, wherein a sum of the thickness of the portion of the second color filter and the thickness of the portion of the third color filter, which overlaps the second portion of the pixel definition layer, is substantially equal to the thickness of the second portion of the pixel definition layer.

19. The display device of claim 16, further comprising a light blocking layer, which overlaps the non-light-emitting region, and a light blocking opening corresponding to the light-emitting opening is defined in the light blocking layer.

20. A display device, comprising:
a display panel;
an input-sensing unit directly disposed on the display panel, the input-sensing unit comprising a sensing electrode;
a first color filter, a second color filter, and a third color filter disposed between the display panel and the input-sensing unit; and
a window unit disposed on the input-sensing unit,
wherein the display panel comprises:
first electrodes disposed on a base insulating layer;

a pixel definition layer disposed on the base insulating layer, the pixel definition layer comprising a first portion, in which openings exposing the first electrodes are defined, and a second portion, which is located adjacent to the first portion and has a thickness larger than the first portion;

a second electrode disposed on the pixel definition layer; and light emitting layers disposed between the second electrode and the first electrodes, wherein:

a portion of the first color filter overlaps the second portion, a portion of the second color filter overlaps the second portion and is disposed on the portion of the first color filter, and a distance between a top surface of the window unit and a first portion of the sensing electrode is larger than a distance between the top surface of the window unit and a second portion of the sensing electrode, the first portion of the sensing electrode overlaps the first portion of the pixel definition layer, and the second portion of the sensing electrode overlaps the second portion of the pixel definition layer.

* * * * *

UNITED STATES PATENT AND TRADEMARK OFFICE
CERTIFICATE OF CORRECTION

PATENT NO. : 10,790,340 B2  
APPLICATION NO. : 16/402415  
DATED : September 29, 2020  
INVENTOR(S) : Hyeonbum Lee, Hyoeng-ki Kim and Kwangwoo Park Page 1 of 1

It is certified that error appears in the above-identified patent and that said Letters Patent is hereby corrected as shown below:

On the Title Page

Under item (30) Foreign Application Priority Data, please delete "10-2018-006829" and insert therefore --10-2018-0062829--.

Signed and Sealed this  
Twenty-second Day of December, 2020

Andrei Iancu  
*Director of the United States Patent and Trademark Office*